(12) United States Patent
Araki et al.

(10) Patent No.: US 8,277,569 B2
(45) Date of Patent: Oct. 2, 2012

(54) SUBSTRATE TREATING APPARATUS AND SUBSTRATE TREATING METHOD

(75) Inventors: Hiroyuki Araki, Kyoto (JP); Kentaro Tokuri, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 612 days.

(21) Appl. No.: 12/161,263

(22) PCT Filed: Jan. 17, 2006

(86) PCT No.: PCT/JP2006/300560
§ 371 (c)(1),
(2), (4) Date: Jul. 17, 2008

(87) PCT Pub. No.: WO2007/083358
PCT Pub. Date: Jul. 26, 2007

(65) Prior Publication Data
US 2010/0236579 A1    Sep. 23, 2010

(51) Int. Cl.
*B08B 3/00* (2006.01)
(52) U.S. Cl. ............... 134/26; 134/32; 134/33; 134/148; 134/153; 134/902
(58) Field of Classification Search ............ 134/26, 134/32, 33, 148, 153, 902
See application file for complete search history.

(56) References Cited

U.S. PATENT DOCUMENTS

| | | | |
|---|---|---|---|
| 5,244,000 A * | 9/1993 | Stanford et al. | 134/95.1 |
| 5,927,303 A | 7/1999 | Miya et al. | |
| 5,997,653 A | 12/1999 | Yamasaka | |
| 2001/0009157 A1 * | 7/2001 | Maekawa et al. | 134/113 |
| 2001/0020482 A1 * | 9/2001 | Scranton et al. | 134/61 |
| 2003/0226577 A1 * | 12/2003 | Orll et al. | 134/1.3 |
| 2004/0040177 A1 | 3/2004 | Izumi | |
| 2004/0226582 A1 * | 11/2004 | Satoshi et al. | 134/25.4 |
| 2005/0022930 A1 | 2/2005 | Moriguchi et al. | |
| 2005/0067000 A1 * | 3/2005 | Kosugi | 134/18 |
| 2005/0238350 A1 * | 10/2005 | Hsu et al. | 396/582 |
| 2006/0008746 A1 | 1/2006 | Onishi et al. | |
| 2006/0123658 A1 | 6/2006 | Izumi | |

FOREIGN PATENT DOCUMENTS

| | | |
|---|---|---|
| JP | 9-148297 | 6/1997 |
| JP | 10-41270 | 2/1998 |
| JP | 10-242110 | * 9/1998 |
| JP | 2000-346549 | 12/2000 |

(Continued)

OTHER PUBLICATIONS

English Machine Translation for JP 10-242110.*

(Continued)

*Primary Examiner* — Michael Kornakov
*Assistant Examiner* — Nicole Blan
(74) *Attorney, Agent, or Firm* — Ostrolenk Faber LLP

(57) ABSTRACT

A substrate processing apparatus and a substrate processing method are capable of restraining or preventing the generation of streaky particles on a substrate surface by excellent removal of a rinsing liquid therefrom. The substrate processing apparatus has a substrate inclining mechanism for inclining a substrate held by a substrate holding mechanism. After a rinsing liquid has been supplied onto a substrate to form a liquid mass, the substrate is inclined at a small angle by the substrate inclining mechanism. Then, the liquid mass is downwardly moved without being fragmented and then falls down without leaving minute droplets on the substrate top. Thereafter, the substrate is returned to a horizontal posture and then dried.

17 Claims, 14 Drawing Sheets

FOREIGN PATENT DOCUMENTS

| | | |
|---|---|---|
| JP | 2003-264167 | 9/2003 |
| JP | 2004-95805 | 3/2004 |
| JP | 2004-330180 | 11/2004 |
| JP | 2005-277230 | 10/2005 |
| JP | 2006-5382 | 1/2006 |
| JP | 2006-13156 | 1/2006 |
| KR | 1992-7190 | 8/1991 |
| KR | 0277114 | 10/1998 |

OTHER PUBLICATIONS

Written Opinion, Apr. 2006.
International Search Report, Apr. 2006.
Korean Office Action issued Mar. 16, 2010 in connection with corresponding Korean Patent Application No. 10-2008-7016449 (JP10-242110 was previously submitted in an Information Disclosure Statement filed Jul. 17, 2008 and is therefore not enclosed.).
Official Action issued on Jun. 12, 2009 in connection with corresponding Taiwanese Patent Application No. 09510856 (References 1-4 were previously cited in an Information Disclosure Statement filed Jul. 17, 2008 and are thererfore not enclosed.).
Official Action issued Jul. 17, 2009 in connection with corresponding Chinese Patent Application No. 200680051270.9 (JP9-148297 was previously cited in an IDS filed Jul. 17, 2008 and is therefore not enclosed).
Notification Concerning Transmittal of International Preliminary Report on Patentability, Jul. 2008.
Notification of Transmittal of Translation of the International Preliminary Report on Patentability, Jul. 2008.

* cited by examiner

SUBSTRATE TREATING APPARATUS AND SUBSTRATE TREATING METHOD

CROSS-REFERENCE TO RELATED APPLICATION

The present application is a 35 U.S.C. §371 national phase conversion of PCT/JP2006/300560 filed Jan. 17, 2006 and is related to JP2004-195956 filed Jul. 1, 2004, both incorporated herein in their entirety.

FIELD OF THE INVENTION

The present invention relates to a substrate processing apparatus for and a substrate processing method of processing a variety of substrates to be processed such as a semiconductor wafer, a liquid-crystal-display-device substrate, a plasma-display substrate, an FED (Field Emission Display) substrate, an optical-disk substrate, a magnetic-disk substrate, a photomagnetic-disk substrate, a photomask substrate and the like.

BACKGROUND ART

In a semiconductor production process, there is conducted a processing of supplying a treating liquid (chemical or deionized water) to a surface of a semiconductor wafer as a substrate to be processed (hereinafter simply referred to as a wafer). In particular, in a substrate cleaning device for cleaning a wafer, a chemical for a cleaning processing is supplied onto the wafer surface, and deionized water is then supplied thereonto to execute a rinsing processing. After subjected to the rinsing processing, the deionized water is being attached to the wafer surface. To remove the deionized water thus attached, the wafer is rotated at a high speed to conduct a drying processing in order to shake off the deionized water on the wafer surface.

A typical substrate drying device used for this drying processing has: a spin chuck to be rotated while horizontally holding a wafer; and a rotationally driving mechanism for rotating the spin chuck at a high speed. This arrangement achieves the substrate drying by shaking off the deionized water with the use of the centrifugal force acting on the deionized water with the rotation.

Cited Patent Document 1: Japanese Unexamined Patent Publication No. 10-41270

SUMMARY OF THE INVENTION

Problems to be Solved by the Invention

For example, in a wafer having a so-called Low-k film (an insulating film made of a material of which relative permittivity is smaller than that of oxide silicon), the wafer surface is hydrophobic. Accordingly, when with deionized water supplied onto the wafer surface, a rinsing processing is conducted and the spin chuck is rotated at a high speed, the film of deionized water on the wafer is fragmented, thus causing the same to become a great number of minute droplets. Then, these minute droplets radially move on the wafer surface. As a result, streaky particles are radially formed on the wafer surface.

These streaky particles are a kind of watermarks and therefore, in the ordinary sense, different from the particles (foreign matter on the wafer surface). However, a particle counter arranged to count the number of particles on the wafer surface, counts also such streaky particles as not distinguished from normal particles.

Thus, it becomes an object to restrain or prevent the generation of such streaky particles.

In this connection, it is an object of the present invention to provide substrate processing apparatus and method each of which capable of restraining or preventing streaky particles from being formed on the substrate surface by successfully removing a rinsing liquid therefrom.

Means for Solving the Problem

A substrate processing apparatus according to a first aspect of the present invention comprises: a substrate holding mechanism (1, 101) capable of holding a substrate (W) with one surface thereof directed upward; a rinsing liquid supply mechanism (15, 17, 112, 120) for supplying a rinsing liquid onto the one surface of the substrate held by the substrate holding mechanism; a substrate inclining mechanism (25, 102) for inclining the substrate held by the substrate holding mechanism from a horizontal posture in which the one surface extends along the horizontal plane, to an inclined posture in which the one surface is inclined at a predetermined angle with respect to the horizontal plane; and substrate drying means (2, 103) for drying the surface of the substrate held by the substrate holding mechanism. It is noted that the alpha-meric characters in the parentheses represent corresponding component elements in the embodiments to be discussed later. This is also applied to the following description.

According to the arrangement above-mentioned, the substrate is inclined by the substrate inclining mechanism after the supply of the rinsing liquid, thus restraining minute droplets of the rinsing liquid from remaining on the substrate surface in the course of removing the rinsing liquid therefrom. Further, the substrate surfaces can be dried by the substrate drying means. Accordingly, the rinsing liquid on the substrate surface and end face in their entirety can successfully be removed.

In particular, when provision is made such that the rinsing liquid on the substrate surface is removed as downwardly moved thereon while it is maintained in the form of a liquid mass, the possibility of minute droplets remaining on the substrate surface is further reduced. Thus, the rinsing liquid is removed from the substrate surface as maintained in the form of a large liquid mass. It is therefore possible to remove the rinsing liquid on the substrate surface while restraining or preventing streaky particles from being generated.

In this specification, the term "liquidmass" refers to a substantially film-like liquid mass which spreads in a predetermined zone on the substrate surface. The liquid mass is preferably maintained in a single mass during the rinsing liquid removal. However, the liquid mass may be fragmented into several pieces during the rinsing liquid removal. That is, the liquid mass may be fragmented into a plurality of pieces as far as no minute droplets remain in that zone of the substrate surface from which at least the rinsing liquid has been removed (which is located upstream with respect to the zone where the rinsing liquid mass is present).

The substrate to be treated may have a hydrophobic or hydrophilic surface, but the present invention is more effective for a substrate having a hydrophobic surface on which minute droplets easily remain.

Instead of deionized water, there may be used as the rinsing liquid; a functional fluid such as carbonated water, electrolytic ionized water, hydrogen water, magnetic water or the like; or ammonia water of small concentration (e.g., about 1 ppm).

The substrate inclining mechanism is preferably arranged to incline the substrate such that the rear edge of the liquid mass is moved on the one surface of the substrate at a speed in the range of 3 mm to 20 mm per second.

According to the arrangement above-mentioned, the substrate is inclined such that the rear end (the highest end) of the liquid mass formed on the substrate by the rinsing liquid is moved at a speed in the range of 3 mm to 20 mm per second, thus securely preventing minute droplets from remaining on the substrate surface. This effectively restrains streaky particles.

Preferably, the substrate processing apparatus further comprises a contact member (5) arranged to come in contact with the lower end face of the substrate in an inclined posture when the substrate is inclined by the substrate inclining mechanism.

According to the arrangement above-mentioned, the contact member in contact with the lower end of the substrate can guide the rinsing liquid which falls down from the substrate.

More specifically, the rinsing liquid falls down along the contact member. This effectively removes the rinsing liquid from the substrate surface. A timing of the contact member to contact with the substrate can be any time during a period of inclination of the substrate (hereinafter the substrate inclination period). For example, the contact member may come in contact with the substrate only at the beginning or end of the substrate inclination period, or any time during the substrate inclination period.

The contact member may be a substrate holding member disposed in the substrate holding mechanism or may be a member provided independently from such a substrate holding member. Further, one or more contact member may be disposed. Most preferably, the contact member is so arranged to come in contact with the substrate end face located in the lowest position when the substrate is inclined.

Preferably, the substrate processing apparatus further comprises control means (40, 110) for controlling the rinsing liquid supply mechanism and the substrate inclining mechanism such that a part or the entire area of the one surface of the substrate horizontally held by the substrate holding mechanism, is covered with a film of a rinsing liquid supplied by the rinsing liquid supply mechanism and that the substrate is then inclined by the substrate inclining mechanism. According to the arrangement above-mentioned, there is formed, on the substrate top, a film of the rinsing liquid which covers a part or the entire area of the substrate surface. In particular, when the rinsing liquid film is formed on the substrate surface in its entirety, the substrate surface does not come in contact with oxygen and the substrate as covered with the large liquid film can be transferred to the rinsing liquid removal step. Thus, the rinsing liquid can successfully be removed from the substrate top. When there is disposed substrate rotating means (2) for rotating the substrate held by the substrate holding mechanism, the substrate surface is preferably covered with a rinsing liquid film with the substrate brought in a resting state or a low-speed rotation state.

Preferably, the control means further controls the substrate drying means such that after the substrate has been inclined by the substrate inclining mechanism to remove the rinsing liquid from the one surface, the liquid component present on the substrate is dried by the substrate drying means. According to the arrangement above-mentioned, after the substrate has been inclined to remove the rinsing liquid from the substrate top, the substrate top is dried. This restrains or prevents the minute droplets from moving on the substrate top, thus restraining the generation of streaky particles.

The substrate drying means may comprise substrate rotating means (2) for rotating a substrate held by the substrate holding mechanism. In such an arrangement, the control means may be arranged such that when drying a substrate, the substrate is rotated by the substrate rotating means to shake off droplets remaining on the end face of the substrate.

According to the arrangement above-mentioned, after the substrate has been inclined to remove the rinsing liquid from the substrate top, the substrate is rotated to shake off minute droplets at the end face thereof. This restrains or prevents the minute droplets from moving on the substrate top, thus restraining the generation of streaky particles.

The control means may be arranged such that after the substrate has been inclined by the substrate inclining mechanism to remove the rinsing liquid from the one surface of the substrate, the substrate is returned to the horizontal posture from an inclined posture by the substrate inclining mechanism and the substrate is then rotated by the substrate rotating means to shake off droplets remaining on the end face of the substrate.

According to the arrangement above-mentioned, after returned to the horizontal posture, the substrate is rotated by the substrate rotating means to shake off the minute droplets on the substrate end face. This prevents the minute droplets shaken off from the substrate end face, from scattering obliquely upwardly of the substrate processing apparatus. There are instances where a substrate holding mechanism capable of rotating a substrate as held, is used as the substrate rotating means. In such a case, at the time of inclining the substrate, the substrate holding mechanism itself is not required to be inclined, but only the substrate may be inclined. Accordingly, the substrate inclining mechanism can be simplified in arrangement.

The substrate drying means may comprise infrared ray generating means (135) for irradiating infrared rays to a substrate held by the substrate holding mechanism. According to the arrangement above-mentioned, the liquid component present on the substrate (including the droplets at the substrate end face) can be evaporated and therefore removed to enable the substrate to be dried by the irradiation of infrared rays, instead by the high-speed rotation of the substrate. More specifically, in such an arrangement, the substrate can be dried in a non-rotation state or a low-speed rotation state.

Preferably, the arrangement above-mentioned further comprises a filter plate (137) which is disposed between the infrared rays generating means and a substrate held by the substrate holding mechanism, and which absorbs, out of the infrared rays irradiated by the infrared ray generating means, at least infrared rays having a wavelength to be absorbed by the substrate held by the substrate holding mechanism, and transmits infrared rays having any other wavelength. According to such an arrangement, while the substrate is restrained in temperature rise, the infrared rays are absorbed by the liquid component present on the substrate surface to cause the liquid component to be evaporated. This restrains the elution of the substrate material due to the heating of the substrate, thus restraining the generation of watermarks.

As the substrate drying means, there may be used a gas supply mechanism (18,138) for supplying, to a substrate held by the substrate holding mechanism, gas at a room temperature (e.g., about 23° C.) or heated gas (e.g., 40° to 150° C.). The gas to be supplied by the gas supply mechanism may be, for example, air or inert gas (nitrogen or the like), or a mixed gas of air or inert gas with vapor of an organic solvent such as IPA (isopropyl alcohol) vapor, HFE (hydrofluoroether) vapor or the like. As the substrate drying means, there may be applied a reduced-pressure drying mechanism for decompressing the space around the substrate held by the substrate holding mechanism, e.g., the processing chamber which houses the substrate holding mechanism.

In order to remove rinsing liquid droplets remaining at the substrate lower end when the substrate is inclined by the substrate holding mechanism, there may be disposed a porous member such as a sponge, or a liquid absorbing member such as a reduced-pressure nozzle arranged to come in contact with the lower end of the substrate in the inclined posture. Thus, the liquid on the substrate can effectively be removed.

The substrate processing apparatus may further comprise an inert gas supply mechanism (18, 19) for supplying inert gas onto the one surface of the substrate held by the substrate holding mechanism. In such a case, the control means preferably controls the inert gas supply mechanism such that when inclining the substrate to remove the rinsing liquid from the one surface thereof, inert gas from the inert gas supply mechanism is supplied onto the one surface of the substrate at at least its zone from which the rinsing liquid has been removed.

According to the arrangement above-mentioned, since inert gas is supplied onto the substrate top at its zone from which the rinsing liquid has been removed, the exposed zone of the substrate surface and the boundary zone between this exposed zone and the zone where the rinsing liquid is present, are brought in an inert gas atmosphere. This restrains the generation of particles due to oxygen present on the substrate surface.

Preferably, the substrate processing apparatus further comprises: a blocking member (10) having a substrate facing surface (11) movable toward the one surface of a substrate held by the substrate holding mechanism; and a blocking member moving mechanism (21) for moving the blocking member toward or away from the one surface of the substrate held by the substrate holding mechanism. In such a case, the control means further controls the blocking member moving mechanism, and the control means preferably controls the blocking member moving mechanism such that when inert gas from the inert gas supply mechanism is supplied onto the one surface of the substrate, the substrate facing surface of the blocking member is located in a predetermined position in close proximity to the one surface of the substrate.

According to the arrangement above-mentioned, with the substrate facing surface of the blocking member brought closer to the substrate top to limit the space in the vicinity thereof, inert gas is supplied to this space. Accordingly, an inert gas atmosphere can securely be produced in the surroundings of the substrate top exposed and boundary zones.

Preferably, the substrate processing apparatus further comprises a blocking member inclining mechanism (60) for inclining the blocking member such that when the substrate is inclined by the substrate inclining mechanism, the substrate facing surface is inclined according to the inclination of the substrate.

According to the arrangement above-mentioned, when the substrate is inclined, the substrate facing surface of the blocking member is accordingly inclined. Thus, the substrate facing surface can sufficiently come close to the substrate top. Accordingly, during the period in which the rinsing liquid is removed from the substrate top, the space in the vicinity of the substrate top is always successfully limited by the blocking member. Therefore, an inert gas atmosphere can securely be produced in the surroundings of the substrate top exposed and boundary zones.

The blocking member inclining mechanism may be an inclination mechanism (60) identical with the substrate inclining mechanism. This inclination mechanism may have, for example, a movable frame (61) which holds a blocking member holding mechanism (23) for holding the blocking member and the substrate holding mechanism; and a rotationally driving mechanism (65) for rotating the movable frame around a predetermined horizontal axis of rotation. With this arrangement, the blocking member and the substrate held by the substrate holding mechanism are integrally inclined by rotating the movable frame.

The inert gas supply mechanism preferably supplies, to the one surface of the substrate, inert gas in flow rate smaller than that at which the rinsing liquid mass on the one surface of the substrate is fragmented.

According to the arrangement above-mentioned, the rinsing liquid can be maintained in the form of a liquid mass. This not only restrains or prevents the generation of streaky particles due to rupture of the rinsing liquid mass, but also produces an inert gas atmosphere in the vicinity of the substrate top exposed and boundary zones.

Preferably, the substrate processing apparatus further comprises a rinsing liquid replenishing mechanism (50) for newly supplying a rinsing liquid onto the rinsing liquid present on the one surface of the substrate brought in the inclined posture by the substrate inclining mechanism.

According to the arrangement above-mentioned, a rinsing liquid is newly replenished to the rinsing liquid present on the substrate surface. This prevents the rupture of the rinsing liquid mass on the substrate. Accordingly, even though the angle of the substrate inclined with respect to the horizontal plane is large, the rupture of the rinsing liquid mass can be avoided, thus enabling the rinsing liquid to be quickly removed from the substrate top. This results in reduction in the processing period of time.

A substrate processing apparatus according to a second aspect of the present invention comprises: a substrate holding mechanism (1) capable of holding a substrate substantially horizontally; a rinsing liquid supply mechanism (15,17) for supplying a rinsing liquid onto the top of the substrate held by the substrate holding mechanism; a gas knife mechanism (70) capable of spraying gas onto the top of the substrate held by the substrate holding mechanism to form a gas spraying zone on the substrate top, and also capable of unidirectionally scanning the substrate top in its entirety by this gas spraying zone; a rinsing liquid replenishing mechanism (77-80) for supplying a rinsing liquid onto the substrate top at its area downstream in the gas-spraying-zone scanning direction with respect to the gas spraying zone formed by the gas knife mechanism; and substrate drying means (2) for drying the surface of the substrate held by the substrate holding mechanism.

According to the arrangement above-mentioned, the gas knife mechanism sprays gas onto the substrate top and the gas spraying zone thereon is moved in one direction to scan the substrate top, thus removing the rinsing liquid therefrom. At this time, a rinsing liquid is supplied onto the substrate surface in the downstream side in the gas-spraying-zone moving direction. Accordingly, the rinsing liquid mass is hardly fragmented downstream in the gas-spraying-zone moving direction, enabling the rinsing liquid to be maintained in a large liquidmass. Thus, the rinsing liquid is removed by the gas knife mechanism while being maintained in a large liquid mass (preferably in a single mass) on the substrate top. As a result, the generation of streaky particles is restrained or prevented.

When the substrate is dried by the substrate drying means after the rinsing liquid has been removed from the substrate surface by the gas knife mechanism, the trace amount of rinsing liquid remaining on the substrate can be removed.

Preferably, the substrate processing apparatus further comprises control means (40) arranged to control the substrate drying means, the rinsing liquid supply mechanism, the gas knife mechanism and the rinsing liquid supply mechanism such that after a rinsing liquid has been supplied onto the substrate top by the rinsing liquid supply mechanism, the substrate top is scanned by the gas spraying zone formed by the gas knife mechanism, while the rinsing liquid is supplied, by the rinsing liquid replenishing mechanism, to the area of the substrate top which is located downstream in the gas-spraying-zone scanning direction, thereby to remove the rinsing liquid from the substrate top, and that a liquid component present on the substrate is then dried by the substrate drying means.

According to the arrangement above-mentioned, after the rinsing liquid has been removed from the substrate top by the gas knife mechanism, the substrate is dried, thus restraining or preventing minute liquid droplets from moving on the substrate top. This restrains the generation of streaky particles.

The substrate drying means may comprise substrate rotating means (2) for rotating a substrate held by the substrate holding mechanism. In such a case, the control means is preferably arranged such that when drying the substrate, the substrate is rotated by the substrate rotating means to shake off liquid droplets remaining on the end face of the substrate. According to the arrangement above-mentioned, when the substrate is rotated by the substrate holding and rotating mechanism after the rinsing liquid has been removed from the substrate surface by the gas knife mechanism, a trace amount of rinsing liquid remaining at the substrate end face can be shaken off by a centrifugal force.

The gas knife mechanism may form a linear gas spraying zone (75, 81-85) on the substrate top. According to the arrangement above-mentioned, by moving the linear gas spraying zone on the substrate top, the rinsing liquid can efficiently be removed therefrom.

The gas knife mechanism may form, on the substrate top, a linear concaved gas spraying zone (81, 84) of which center portion is retreated to the upstream side in the gas-spraying-zone scanning direction. According to the arrangement above-mentioned, since the linear gas spraying zone is retreated, at its center portion, to the upstream side in the gas-spraying-zone scanning direction, the rinsing liquid can be removed from the substrate top while being gathered inside of the linear gas spraying zone. This securely restrains or prevents the rupture of the rinsing liquid mass.

Preferably, the substrate processing apparatus further comprises a substrate inclining mechanism (25) for inclining a substrate held by the substrate holding mechanism from a horizontal posture in which the substrate top extends along the horizontal plane, to an inclined posture in which the substrate top is inclined at a predetermined angle with respect to the horizontal plane.

According to the arrangement above-mentioned, the joint use of the substrate inclination and the gas knife mechanism can more securely remove liquid droplets present on the substrate top. In such a case, the rinsing liquid is replenished into the area downstream in the gas knife scanning direction. This restrains or prevents the rinsing liquid mass on the substrate top from being fragmented, thus restraining or preventing rinsing liquid minute droplets from remaining on the substrate top.

A substrate processing method according to one aspect of the present invention comprises: a substrate holding step of holding a substrate (W), with one surface thereof directed upward, by a substrate holding mechanism (1,101); a rinsing liquid supply step of supplying a rinsing liquid to the one surface of the substrate held by the substrate holding mechanism at the substrate holding step; a substrate inclining step of inclining, after the rinsing liquid supply step, the substrate held by the substrate holding mechanism from a horizontal posture in which the one surface extends along the horizontal plane, to an inclined posture in which the one surface is inclined at a predetermined angle with respect to the horizontal plane, thereby to downwardly move the rinsing liquid while it is maintained in the form of a liquid mass on the one surface, thus causing the rinsing liquid to be removed therefrom; and a drying step of drying the substrate surface after the substrate inclining step.

The substrate inclining step is preferably arranged to incline the substrate such that the rear edge of the liquid mass is moved on the one surface of the substrate at a speed in the range of 3 mm to 20 mm per second. According to the method above-mentioned, the rinsing liquid can be removed from the substrate top while more securely restraining or preventing the rinsing liquid mass on the substrate top from being fragmented.

A substrate processing method according to another aspect of the present invention comprises: a substrate holding step of holding a substrate (W) substantially horizontally by a substrate holding mechanism (1); a rinsing liquid supply step of supplying a rinsing liquid onto the top of the substrate held by the substrate holding mechanism at the substrate holding step; a gas knife step of spraying, after the rinsing liquid supply step, gas onto the top of the substrate held by the substrate holding mechanism, by a gas knife mechanism (70) to form a gas spraying zone (75, 81-85) on the substrate top, and of unidirectionally scanning the substrate top in its entirety by this gas spraying zone; a rinsing liquid replenishing step of supplying, in parallel to the gas knife step, a rinsing liquid onto the substrate top at its area downstream in the gas-spraying-zone scanning direction rather than the gas spraying zone formed by the gas knife mechanism; and a drying step of drying the substrate surface after the gas knife step and the rinsing liquid replenishing step.

The drying step may comprise a step of rotating the substrate held by the substrate holding mechanism to shake off liquid droplets remaining at the end face of the substrate.

The drying step may comprise a step of irradiating infrared rays from infrared rays generating means to the substrate held by the substrate holding mechanism.

The rinsing liquid supply step preferably comprises a liquid film covering step of covering, with a rinsing liquid film, the whole area of the one surface of the substrate horizontally held by the substrate holding mechanism at the substrate holding step.

The rinsing liquid supply step is preferably arranged such that the liquid film covering step is executed through a liquid mass developing step of developing a large rinsing liquid mass on the substrate top with the substrate held in a resting state or a low-speed rotation state.

These and other objects, features and operational effects of the present invention will be more fully apparent from the following detailed description when taken in conjunction with the accompanying drawings.

BEST MODE FOR CARRYING OUT THE INVENTION

The following description will discuss in detail an embodiment of the present invention with reference to the attached drawings.

Figure 1:
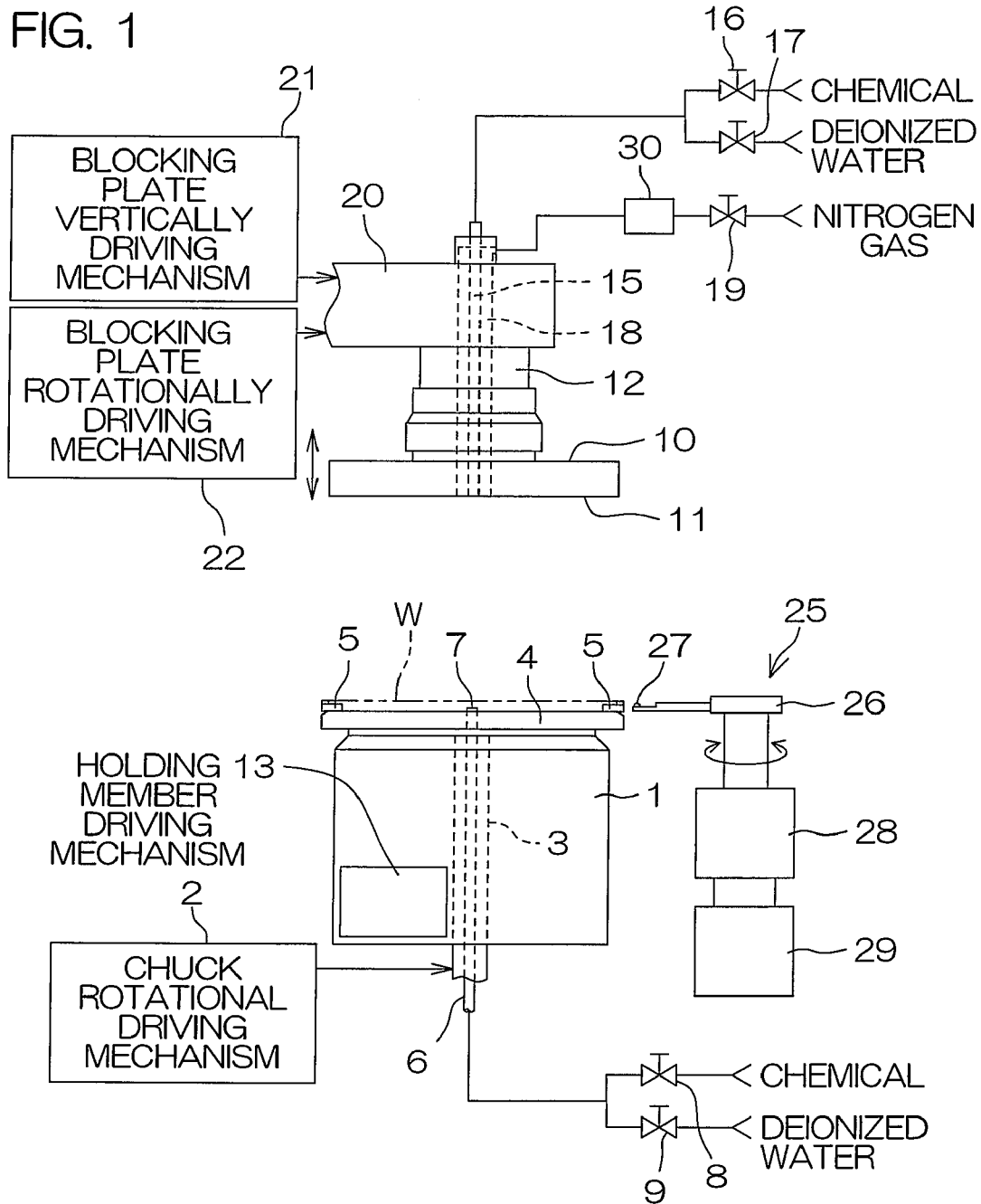
FIG. 1 is a schematic view illustrating the arrangement of a substrate processing apparatus according to a first embodiment of the present invention.

FIG. 1 is a schematic view illustrating the arrangement of a substrate processing apparatus according to a first embodiment of the present invention. This substrate processing apparatus is a sheet-supply type processing apparatus for conducting a processing, with a treating liquid, on a substantially circular substrate W such as a semiconductor wafer, and has a spin chuck 1 for holding the substrate W substantially horizontally and for rotating the substrate W around the substantially vertical axis of rotation passing through the center thereof. The substrate W is provided, for example, on the device forming surface thereof with a hydrophobic surface likewise in a silicon wafer of which surface has a Low-k film. The substrate W of this type is held by the spin chuck 1 with its device forming surface (hydrophobic surface) turned up.

The spin chuck 1 has a substantially disk-like spin base 4 fixed onto the upper end of a rotating shaft 3 to be rotated by a chuck rotational driving mechanism 2, and also has a plurality of holding members 5 for holding the substrate W which are disposed at the peripheral edge portion of the spin base 4 substantially at regular angular intervals. The rotating shaft 3 is a hollow shaft in which inserted is an underside treating liquid supply tube 6 to which a chemical or a deionized water serving as a treating liquid is selectively supplied. The underside treating liquid supply tube 6 extends to a position in the vicinity of the underside center of the substrate W held by the spin chuck 1, and is provided at the tip thereof with an underside nozzle 7 for ejecting a treating liquid toward the underside center of the substrate W.

Provision is made such that a chemical from a chemical (for example, etching solution) source is supplied to the underside treating liquid supply tube 6 through a chemical valve 8 and that deionized water (deionized deionized water) from a deionized water source is supplied to the underside treating liquid supply tube 6 through a deionized water valve 9.

Disposed above the spin chuck 1 is a circular blocking plate 10 having a diameter substantially same as that of the substrate W and provided at its underside with a substrate facing surface 11 which is opposite to the top of the substrate W. Fixed to the top of the blocking plate 10 is a rotating shaft 12 extending along the axis common to that of the rotating shaft 3 of the spin chuck 1. This rotating shaft 12 is a hollow shaft in which inserted is a treating liquid nozzle 15 for supplying a treating liquid onto the top of the substrate W. Provision is made such that a chemical or deionized water (deionized deionized water as an example of a rinsing liquid) is supplied to the treating liquid nozzle 15 through a chemical valve 16 or a deionized water valve 17 respectively.

Formed between the inner wall face of the rotating shaft 12 and the outer wall face of the treating liquid nozzle 15 is a nitrogen gas supply path 18 for supplying nitrogen gas as inert gas toward the top center of the substrate W. The nitrogen gas supplied from the nitrogen gas supply path 18 is supplied to the space between the top of the substrate W and the underside (substrate facing surface 11) of the blocking plate 10. Provision is made such that nitrogen gas is supplied to the nitrogen gas supply path 18 through a nitrogen gas valve 19 and a flow rate adjusting unit 30. The flow rate adjusting unit 30 is arranged to change the flow rate of the nitrogen gas to be supplied to the nitrogen gas supply path 18 (for example in two levels).

The rotating shaft 12 is attached as hanging down from the vicinity of the tip of an arm 20 extending substantially horizontally. In association with the arm 20, there is disposed a blocking plate vertically driving mechanism 21 for vertically moving, by vertically moving the arm 20, the blocking plate 10 between a proximal position in the vicinity of the top of the substrate W held by the spin chuck 1 and a retreat position greatly upwardly separated from the spin chuck 1. Also in association with the arm 20, there is further disposed a blocking plate rotationally driving mechanism 22 for rotating the blocking plate substantially in synchronism with the rotation of the substrate W executed by the spin chuck 1.

By approaching the substrate facing surface 11 of the blocking plate 10 to the top of the substrate W and by introducing nitrogen gas between the substrate facing surface 11 and the substrate W, the vicinity of the top of the substrate W can be maintained in a nitrogen gas atmosphere.

Figure 2:
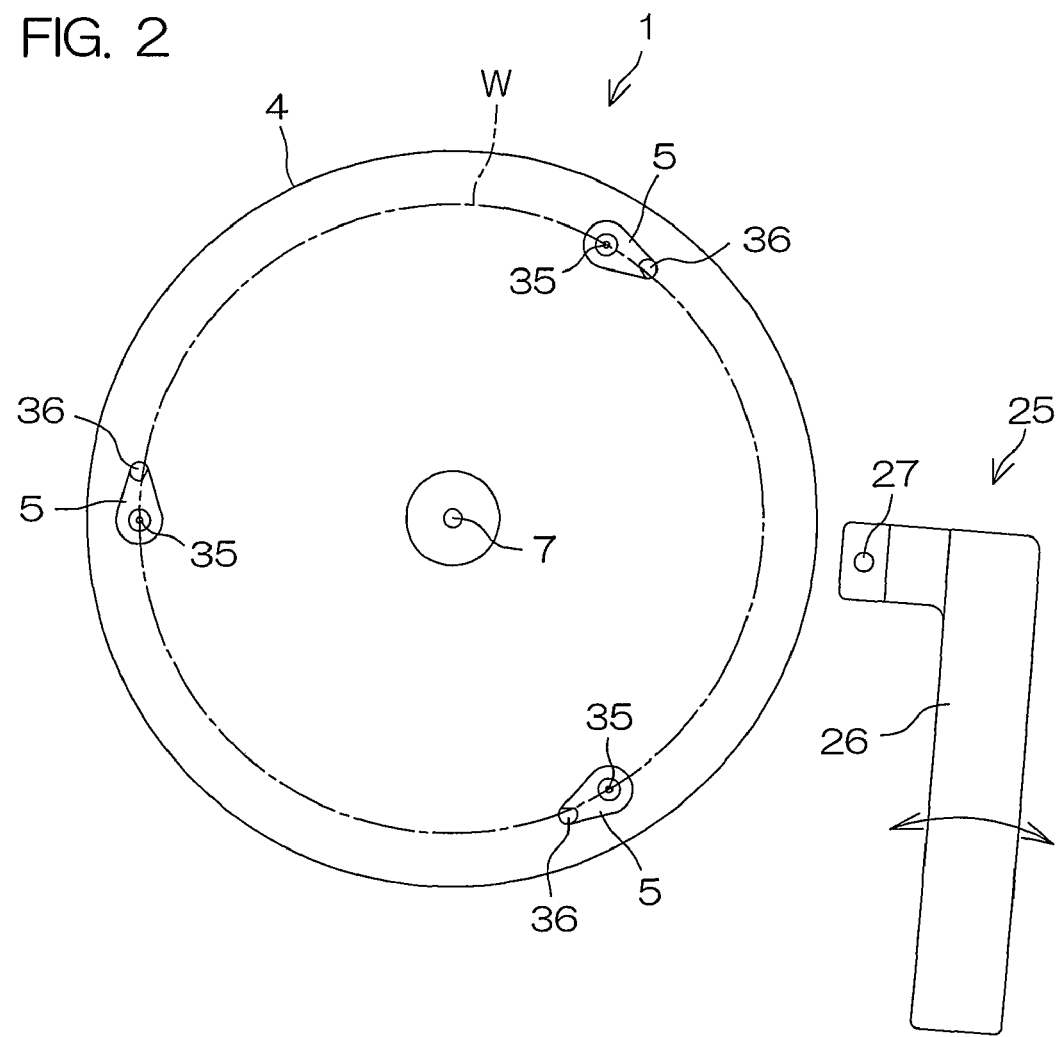
FIG. 2 is a plan view of a spin chuck disposed in the substrate processing apparatus in FIG. 1.

FIG. 2 is a plan view of the spin chuck 1. The spin chuck 1 is provided at the peripheral edge portion of the disk-like spin base 4 with, for example, three holding members 5 substantially at regular angular intervals. Each of the holding members 5 has a support member 35 for supporting, in point contact, the underside of the peripheral edge portion of the substrate W, and a holding portion 36 to come in contact with the peripheral edge face of the substrate W. Each holding member 5 is arranged to be rotated around the vertical axis passing through the center of the support member 35. Accordingly, each holding member 5 is arranged to take a holding position in which the holding portion 36 comes in contact with the peripheral end face of the substrate W, and a release position in which the holding portion 36 is retreated from the peripheral end face of the substrate W. These holding members 5 are arranged to be driven in synchronism with one another by a holding member driving mechanism 13 (See FIG. 1).

As shown in FIG. 1 and FIG. 2, disposed at the side of the spin chuck 1 is a substrate inclining mechanism 25 for inclining the substrate W held by the spin chuck 1. This substrate inclining mechanism 25 has: a horizontally extending swing arm 26 substantially in the L shape; a substrate support member 27 disposed on the top of the tip of the swing arm 26; a swing driving mechanism 28 for swinging the swing arm 26 around the vertical axis passing through the center of the base end portion thereof; and an arm vertically driving mechanism 29 for vertically moving the swing arm 26. By swinging the swing arm 26 by the swing driving mechanism 28, the substrate support member 27 enters into the space between the top of the spin base 4 and the underside of the substrate W with the substrate W held on the spin chuck 1. Further, by vertically raising the swing arm 26 by the arm vertically driving mechanism 29, the upper end of the substrate support member 27 is caused to come in contact with the underside of the peripheral edge of the substrate W and the substrate W can then be brought up with the peripheral edge thereof supported by the substrate support member 27.

Accordingly, when the holding state of the substrate W provided by the holding members 5 is released and a portion of the peripheral edge of the substrate W is raised by the substrate support member 27, the posture of the substrate W can be changed from a horizontal posture substantially parallel with the horizontal plane to an inclined posture inclined with respect to the horizontal plane. When operating the substrate inclining mechanism 25 to incline the substrate W, the spin chuck 1 is controlled in rotation position such that at least one of the holding members 5 is located in the lower side of the inclination direction and that the substrate support member 27 heading under the substrate W does not interfere with any of the holding members 5. More specifically, the spin chuck 1 is controlled in rotation position such that when three holding members 5 are disposed along the peripheral edge of the disk-like spin base 4 substantially at regular angular intervals, one of the holding members 5 is opposite to the substrate support member 27 at an angle of 180° with the rotational center of the spin chuck 1 sandwiched. The control of the spin chuck 1 in rotation position can be, for example, achieved by disposing, in association with the spin chuck 1, a rotation position sensor 39 (See FIG. 3) such as a rotary encoder or the like and by controlling the chuck rotational driving mechanism 2 based on an output of this rotation position sensor 39.

Figure 3:
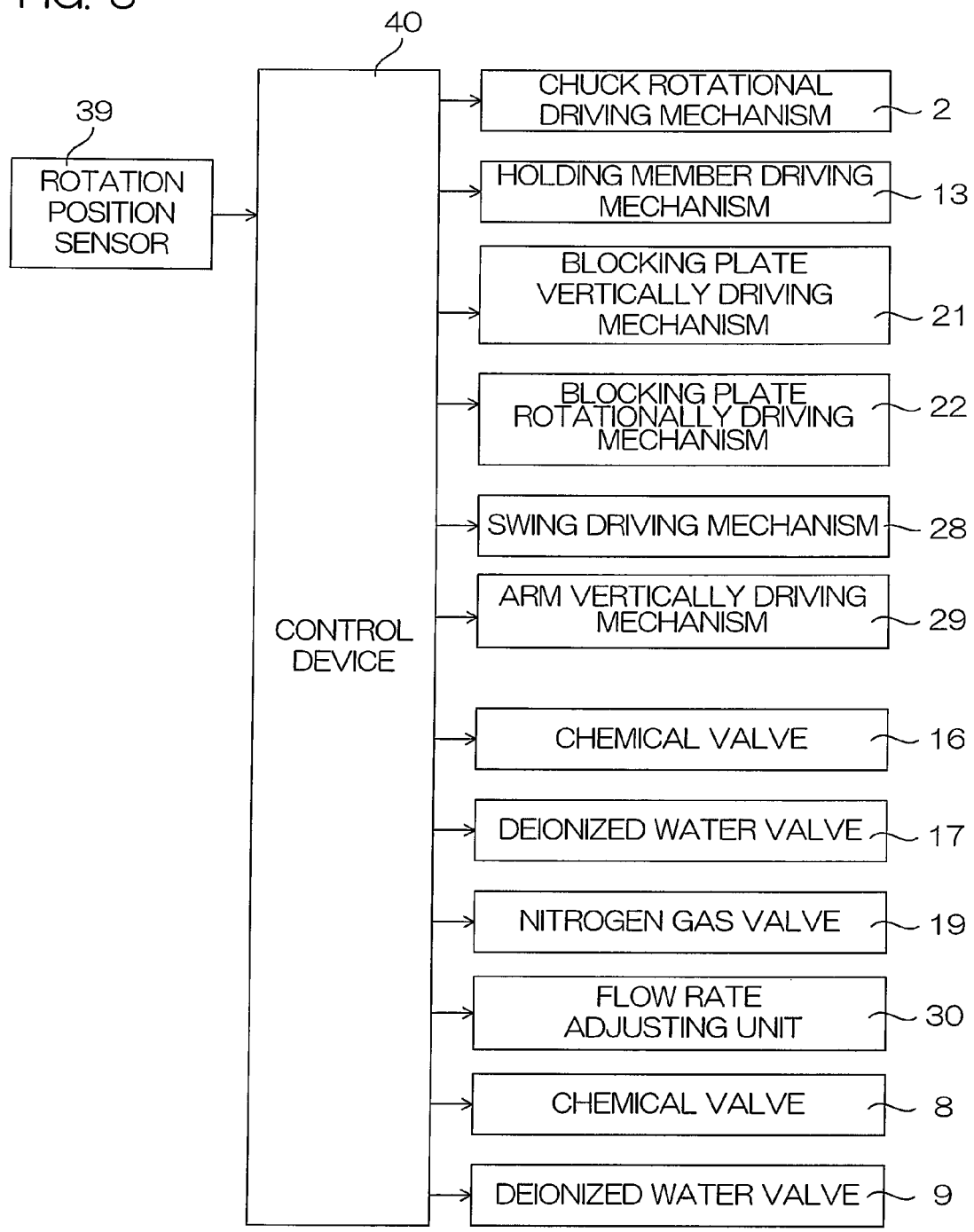
FIG. 3 is a block diagram illustrating the electric arrangement of the substrate processing apparatus.

FIG. 3 is a block diagram illustrating the electric arrangement of the substrate processing apparatus. Provision is made such that a control device 40 comprising a computer controls the operation of each of the chuck rotational driving mechanism 2, the holding member driving mechanism 13, the blocking plate vertically driving mechanism 21, the blocking plate rotationally driving mechanism 22, the swing driving mechanism 28 and the arm vertically driving mechanism 29. Further, the control device 40 is arranged to control the opening/closing of the chemical valve 16, the deionized water valve 17, the nitrogen gas valve 19, the chemical valve 8 and the deionized water valve 9. Provision is made such that the control device 40 receives an output signal of the rotation position sensor 39 for detecting the rotation position of the spin chuck 1.

Figure 4:
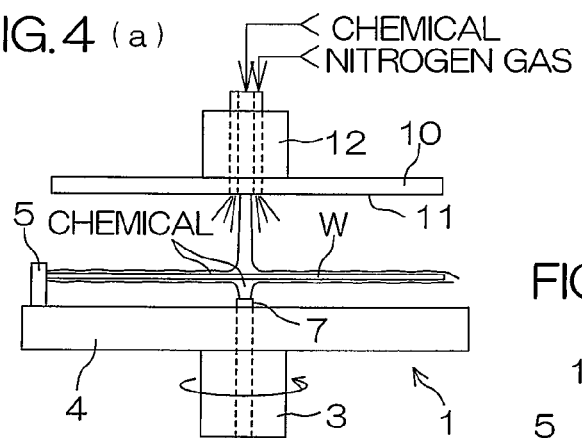
FIG. 4 (*a*) to FIG. 4 (*e*) are views illustrating the flow of a substrate processing to be performed by the substrate processing apparatus.
Figure 4:
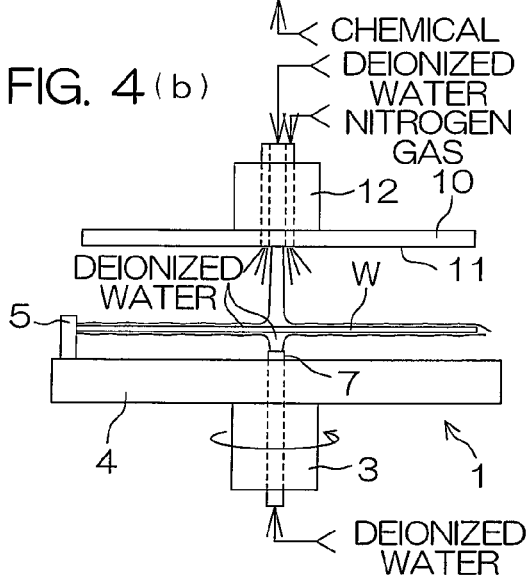
Figure 4:
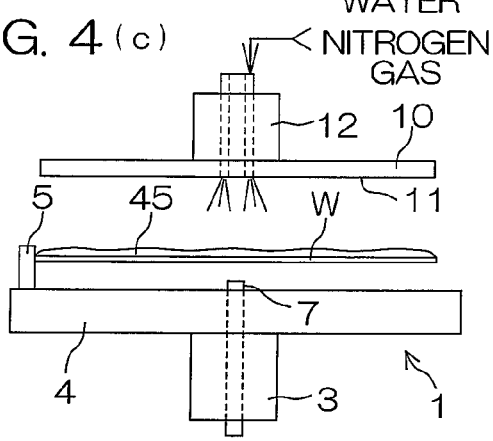
Figure 4:
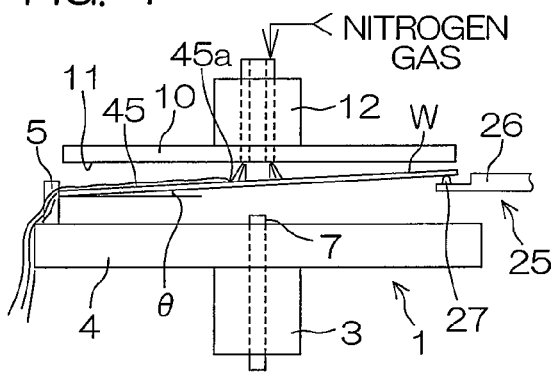
Figure 4:
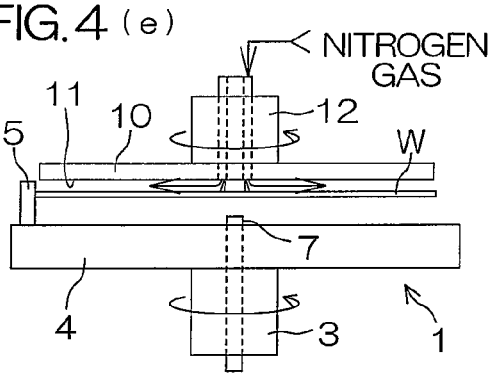
Figure 5:
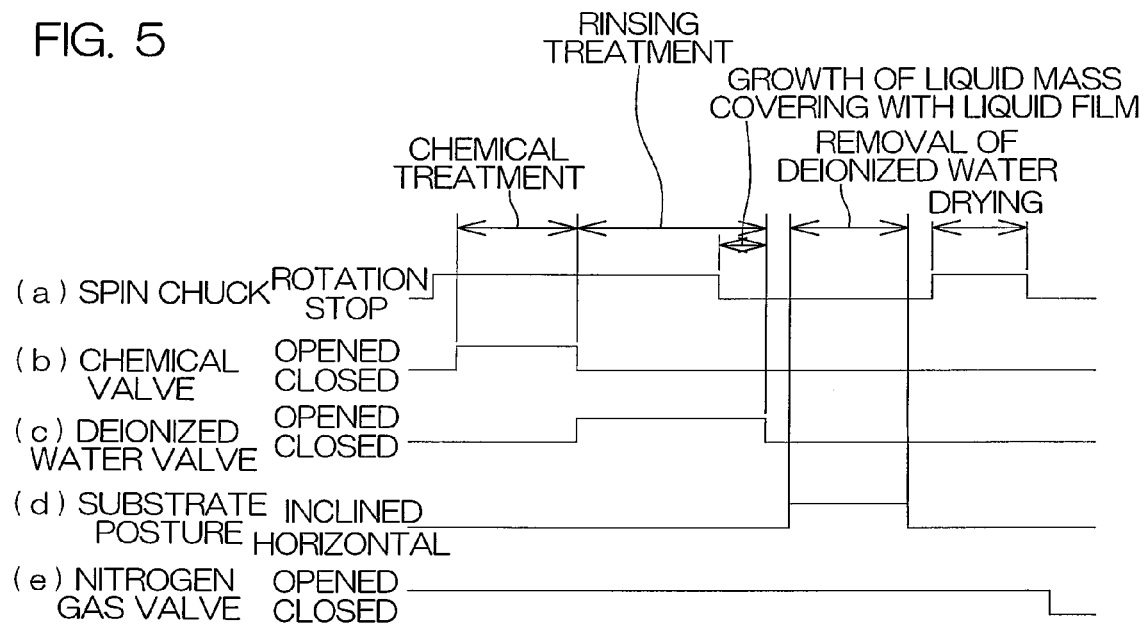
FIG. 5 is a time chart illustrating contents to be controlled by the control device.

FIG. 4 (*a*) to FIG. 4 (*e*) are views illustrating the flow of substrate processing to be performed by the substrate processing apparatus. FIG. 5 is a time chart illustrating the contents to be controlled by the control device 40: the rotation/stop of the spin chuck 1 (FIG. 5(*a*)); opening/closing of the chemical valve 16 (FIG. 5(*b*)); opening/closing of the deionized water valve 17 (FIG. 5(*c*)); the inclined state of the substrate W inclined by the substrate inclining mechanism 25 (FIG. 5(*d*)); and opening/closing of the nitrogen gas valve 19 (FIG. 5(*e*)).

When an untreated substrate W is delivered to the spin chuck 1 from a substrate transfer robot (not shown), the control device 40 executes a chemical processing step of supplying a chemical to the substrate W as shown in (FIG. 4(*a*)). More specifically, the control device 40 controls the holding member driving mechanism 13 such that the holding members 5 hold the substrate W. Then, the control device 40 controls the chuck rotational driving mechanism 2 to rotate the spin chuck 1. At the same time, the control device 40 opens the chemical valves 8, 16 to supply chemicals to the top of the substrate W from the treating liquid nozzle 15. At this time, the blocking plate 10 is retreated to a position upwardly separated from the substrate W and the deionized water valve 17 is held as closed.

As in the manner above-mentioned, the chemicals are supplied to the top and underside of the substrate W, and the substrate W is rotated in the horizontal posture together with the spin chuck 1. This causes the chemicals to be spread on the top and underside of the substrate W in their whole areas, and the substrate processing with the chemical progresses. During the chemical processing, the nitrogen gas valve 19 may be opened or closed.

After such a chemical processing has been executed for a predetermined period of time, the control device 40 executes a rinsing processing for substituting the chemicals on the substrate W with deionized water as shown in (FIG. 4(*b*)). More specifically, the control device 40 closes the chemical valves 8, 16 and instead opens the deionized water valves 9, 17. Thus, deionized water is supplied to the top and underside of the substrate W, and the substrate W is rotated in the horizontal posture together with the spin chuck 1, causing the deionized waters to be spread on the top and underside of the substrate W in their whole areas. In this manner, the chemicals on the top and underside of the substrate W are substituted by the deionized waters. During this rinsing processing, the nitrogen gas valve 19 is preferably opened to provide a nitrogen gas atmosphere around the substrate W.

At the end stage of the rinsing processing, the control device 40 controls the chuck rotational driving mechanism 2 to progressively reduce the rotational speed of the spin chuck 1 and the spin chuck 1 is stopped rotating. At this time, the control device 40 controls the rotation stop position of the spin chuck 1 based on an output of the rotation position sensor 39. More specifically, as mentioned earlier, the rotation stop position of the spin chuck 1 is controlled such that one of the holding members 5 is located in a position opposite to the substrate support member 27 of the substrate inclining mechanism 25 with the rotation center of the spin chuck 1 sandwiched, causing none of the holding members 5 to interfere with the substrate support member 27.

After the spin chuck 1 has stopped rotating, the control device 40 then closes the deionized water valves 9, 17 after a delay of a predetermined period of time (e.g., about 5 seconds). Accordingly, when the rotational speed of the spin chuck 1 reaches to an extremely low speed, a liquid mass of deionized water 45 starts growing on the top of the substrate W (liquid mass growing step). Then, by continuously supplying deionized water even after the spin chuck 1 has stopped rotating, the liquid mass of deionized water 45 grows on the top of the substrate W as substantially covering the whole area thereof until the deionized water valves 9, 17 are closed, as shown in (FIG. 4(*c*)) (liquid film covering step). At the liquid film covering step after the spin chuck 1 has stopped rotating, the control device 40 controls the holding member driving mechanism 13 to release the holding members 5. This restrains the deionized water from falling down along the holding members 5, thus facilitating the growth of the liquid mass of deionized water 45.

From this state, the control device 40 executes a deionized water removing step at which the substrate W is inclined to remove the deionized water from the top of the substrate W, as shown in the (FIG. 4(d)). More specifically, the control device 40 controls the swing driving mechanism 28 and the arm vertically driving mechanism 29 such that the substrate support member 27 enters into the gap between the top of the spin base 4 and the underside of the substrate W. At this time, the control device 40 controls the holding member driving mechanism 13 such that the holding members 5 are maintained as released, causing the substrate W to be liberated. With the substrate W liberated from the holding state, the control device 40 controls the arm vertically driving mechanism 29 to vertically move the substrate support member 27 to a predetermined height.

This causes the substrate W to take an inclined posture inclined at a predetermined angle θ (e.g., 1°-5°) with respect to the horizontal plane. The angle θ is determined such that the liquid mass of deionized water 45 moves downwardly without being fragmented but maintained in the form of a single liquid mass, and is then removed from the top of the substrate W. More specifically, there is determined the height to which the substrate support member 27 is raised such that such an angle is formed between the horizontal plane and the substrate W in the inclined posture.

In order to remove the liquid mass of deionized water 45 in the form of a single liquid mass from the lower side of the substrate W, the angle θ is preferably determined such that the moving speed of the liquid mass rear edge 45a (the edge of the highest portion of the liquid mass of deionized water 45) to be moved on the top of the substrate W, is in the range of 3 mm to 20 mm per second, more preferably in the range of 3 mm to 5 mm per second.

The lower-side end edge of the substrate W in the inclined posture comes in contact with the holding member 5 located in the position opposite to the substrate support member 27 with the rotation center of the spin chuck 1 sandwiched (that is, the position corresponding to the lowest end face of the substrate W in the inclined posture). Accordingly, the liquid mass of deionized water 45 falling down on the top of the substrate W is guided along this holding member 5, enabling the same to smoothly flow down from the top of the substrate W.

Prior to the deionized water removing step conducted by inclining the substrate W, the control device 40 controls the blocking plate vertically driving mechanism 21 such that the substrate facing surface 11 is moved closer to the top of the substrate W to such an extent that the blocking plate 10 does not come in contact with the substrate W after inclined. More specifically, the blocking plate 10 does not come in contact with the substrate W when the substrate facing surface 11 is located in a position equal to or higher than a predetermined lower limit height (=substrate diameter×tan θ) from the top of the substrate W in the horizontal posture.

Further, during the deionized water removing step, the control device 40 maintains the nitrogen gas valve 19 as opened. Thus, the space above the substrate W is limited by the blocking plate 10 and this limited space is filled with nitrogen gas. At this state, the substrate W inclining operation starts with the substrate inclining mechanism 25. Accordingly, that zone of the top of the substrate W where the deionized water has been removed (exposed zone), and the boundary zone between this exposed zone and the zone where the liquid mass of deionized water 45 is present, are always in a nitrogen gas atmosphere during the deionized water removing step. This restrains or prevents an oxide from being formed in these zones.

At the deionized water removing step, the control device 40 controls the flow rate adjusting unit 30 to adjust the flow rate of nitrogen gas to a predetermined small flow rate. The nitrogen gas supply flow rate at this time is determined as smaller than the flow rate at which the liquid mass of deionized water 45 on the substrate W is broken. More specifically, the nitrogen gas supply flow rate at this time is preferably in the range of 1 to 10 liters/minute, and more preferably at 5 liters/minute.

At the deionized water removing step, the blocking plate 10 may be rotated or stopped rotating.

After the liquid mass of deionized water 45 on the substrate W has been removed in the manner above-mentioned, the control device 40 controls the arm vertically driving mechanism 29 to lower the substrate support member 27. Accordingly, the substrate W is returned to the horizontal posture as supported by the holding members 5. Further the control device 40 controls the swing driving mechanism 28 such that the swing arm 26 is swung to retreat the substrate support member 27 to the side of the spin chuck 1.

Then, the control device 40 controls the holding member driving mechanism 13 to hold the substrate W by the holding members 5. Then, as shown in FIG. 4(e), the control device 40 controls the chuck rotational driving mechanism 2 such that the spin chuck 1 is rotated for a predetermined period of time (e.g., 15 to 30 seconds) at a predetermined drying rotational speed (e.g., 3000 rpm), thus executing a drying step. Accordingly, even though minute droplets remain at the peripheral end face of the substrate W, such droplets can be shaken off by a centrifugal force. These minute droplets which do not pass through the device forming zone of the top of the substrate W, do not contribute to the formation of streaky particles.

At the drying step, the control device 40 controls the blocking plate vertically driving mechanism 21 such that the substrate facing surface 11 of the blocking plate 10 is moved closer to the top of the substrate W, for example, by a distance of about 0.5 mm to about 5.0 mm and that the blocking plate 10 is rotated in the same direction of the substrate W by the blocking plate rotationally driving mechanism 22. This limits the space formed above the substrate W and this limited space is filled with nitrogen gas. Further, this nitrogen gas forms an air current oriented outward of the substrate W. This not only restrains or prevents an undesired oxide from being formed on the top of the substrate W, but also restrains or prevents the scattering materials from the processing chamber from attaching to the surfaces of the substrate W.

At the drying step, the control device 40 controls the flow rate adjusting unit 30 such that the nitrogen gas supply flow rate is set to a predetermined high flow rate. The nitrogen gas supply flow rate at this time is set to a value larger than that at the deionized water removing step. More specifically, the nitrogen gas supply flow rate at this time is preferably in the range of 5 to 20 liters/minute, and more preferably at 10 liters/minute.

After such a drying step has been executed for a predetermined period of time (e.g., 15 seconds to 30 seconds), the control device 40 controls the chuck rotational driving mechanism 2 to stop the rotation of the spin chuck 1, controls the blocking plate vertically driving mechanism 21 to retreat the blocking plate 10 upwardly, controls the holding member driving mechanism 13 to release the holding state of the substrate W provided by the holding members 5, and then closes the nitrogen gas valve 19.

Thereafter, the treated substrate W is carried out from the spin chuck 1 by a substrate transfer robot.

According to this embodiment discussed in the foregoing, the substrate W is inclined before the spin chuck 1 is rotated at a high speed to execute a drying step, a large liquid mass of deionized water 45 developed on the substrate W can be removed, without being fragmented, to the outside of the substrate W. More specifically, the liquidmass of deionized water 45 falls down without leaving minute droplets on the top of the substrate W. Accordingly, no minute droplets remain on the top (device forming surface) of the substrate W, thus overcoming the problem of streaky particles.

Figure 6:
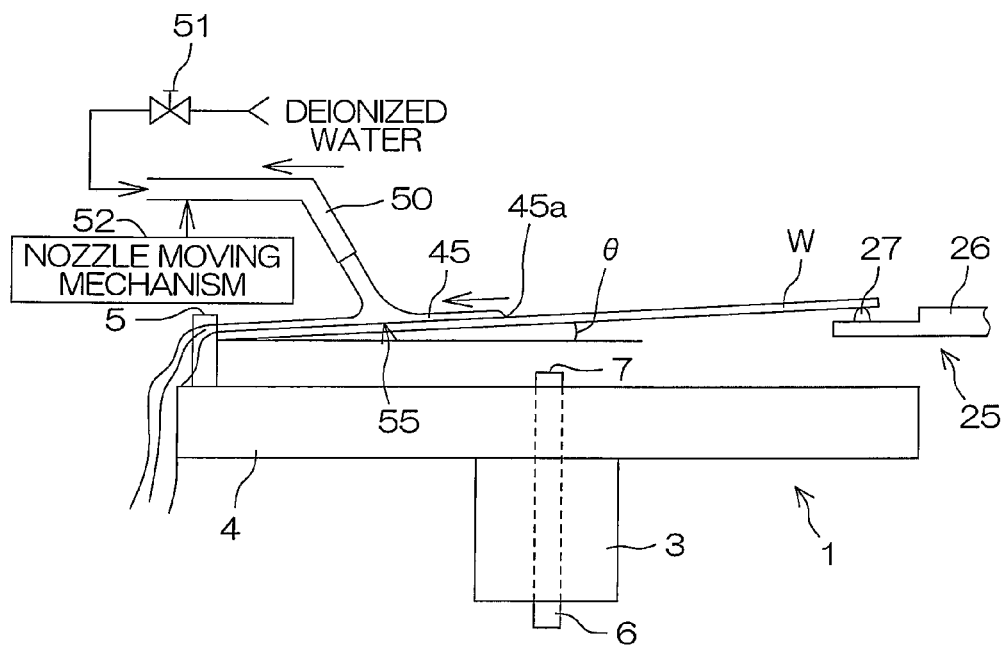
FIG. 6 is a schematic view illustrating a modification of the first embodiment.

FIG. 6 is a schematic view illustrating a modification of the embodiment above-mentioned. In this modification, there is disposed a moving nozzle 50 capable of supplying, to the top of a substrate W, deionized water serving as a rinsing liquid and also capable of moving the deionized water supplying position on the substrate W. Supplied to the moving nozzle 50 is deionized water from the deionized water supply source through a deionized water valve 51. Opening/closing of the deionized water valve 51 is controlled by the control device 40 above-mentioned. In order to horizontally move the moving nozzle 50 above the spin chuck 1, there is disposed a nozzle moving mechanism 52, of which operation is to be controlled by the control device 40.

At the deionized water removing step in which the substrate W is inclined by the substrate inclining mechanism 25 to remove the liquid mass of deionized water 45 on the top of the substrate W, the control device 40 opens the deionized water valve 51 and controls the nozzle moving mechanism 52 such that the moving nozzle 50 is moved above the substrate W in the inclined posture. More specifically, the moving nozzle 50 is so moved as to maintain the state in which the arriving point 55 of deionized water from the moving nozzle 50 is located in the lower side with respect to the rear edge 45a of the liquid mass of deionized water 45 moving on the substrate W and is therefore located within the liquid mass of deionized water 45.

According to the arrangement above-mentioned, the replenishment of new deionized water to the liquid mass of deionized water 45 from the moving nozzle 50, securely prevents the liquid mass of deionized water 45 from being fragmented. It is therefore possible to more efficiently remove the deionized water on the top of the substrate W. Accordingly, even though the angle θ formed between the horizontal plane and the substrate W inclined to the inclined posture, is relatively large, it is possible to prevent the liquid mass of deionized water 45 from being fragmented. Accordingly, the removal of the deionized water from the top of the substrate W can more quickly be executed. This shortens the processing period of time.

Figure 7:
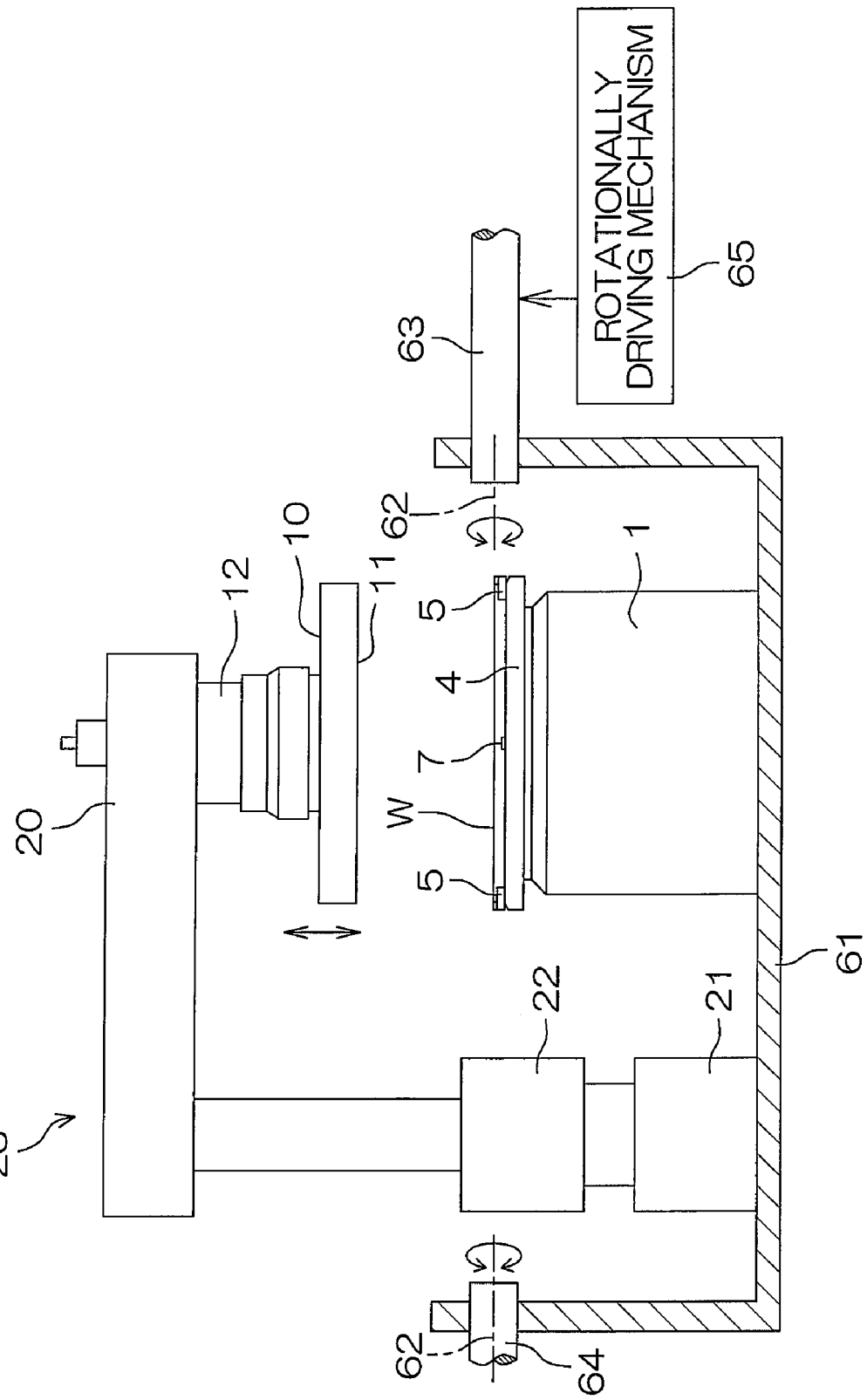
FIG. 7 is a schematic view illustrating the arrangement of a modification of the substrate inclining mechanism.

FIG. 7 is a schematic view illustrating a modification of the substrate inclining mechanism for inclining the substrate W. The substrate inclining mechanism 60 has a movable frame 61 for commonly holding a spin chuck 1 and a blocking plate holding mechanism 23 including an arm 20, a blocking plate vertically driving mechanism 21 and a blocking plate rotationally driving mechanism 22. This movable frame 61 is supported by a pair of rotation support shafts 63, 64 each rotatable around a horizontal axis of rotation passing through substantially the center of a substrate W held substantially horizontally by the spin chuck 1. One rotation support shaft 63 is coupled to a rotationally driving mechanism 65 capable of bidirectionally rotating the rotation support shaft 63 around the axis of rotation 62. Provision is made such that this rotationally driving mechanism 65 is controlled by the control device 40 above-mentioned.

According to the arrangement above-mentioned, the deionized water removing step above-mentioned can be executed by controlling the rotationally driving mechanism 65 to integrally incline the spin chuck 1 and the blocking plate 10 at an angle θ. Then, the substrate facing surface 11 of the blocking plate 10 is inclined according to the inclination of the substrate W to maintain the substrate facing surface 11 and the substrate W in parallel to each other. Accordingly, at the deionized water removing step, the substrate facing surface 11 of the blocking plate 10 can be brought to a position closer to the top of the substrate W. This securely produces a nitrogen gas atmosphere in the vicinity of the top of the substrate W.

Figure 8:
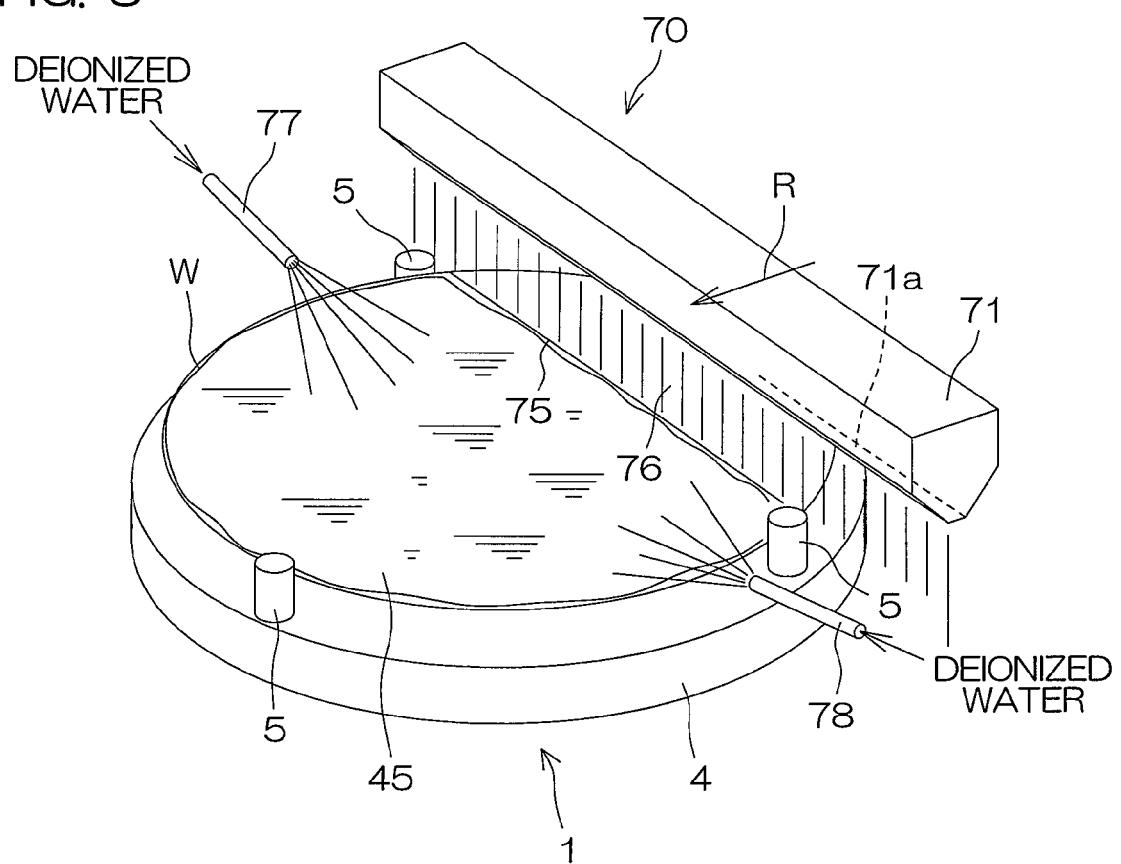
FIG. 8 is a schematic perspective view illustrating the arrangement of a substrate processing apparatus according to a second embodiment of the present invention.
Figure 9:
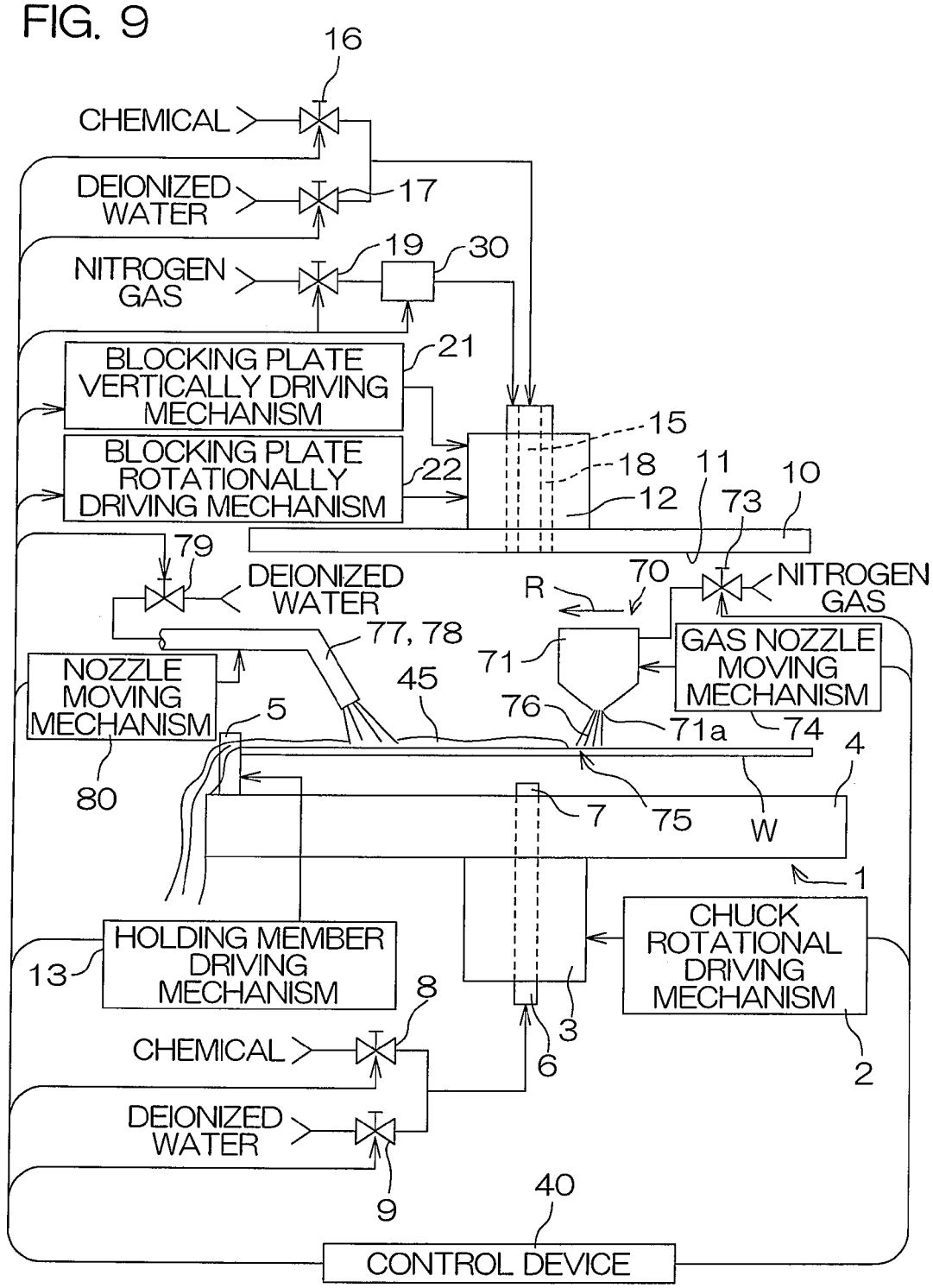
FIG. 9 is a schematic view of the general arrangement of the substrate processing apparatus of the second embodiment.

FIG. 8 is a schematic perspective view illustrating the arrangement of a substrate processing apparatus according to a second embodiment of the present invention, while FIG. 9 is a schematic side view illustrating the operation of the arrangement in FIG. 8. It is noted that in these FIG. 8 and FIG. 9, like functional parts are designated by like reference numerals used in FIG. 1 to FIG. 7.

This substrate processing apparatus has a gas knife mechanism 70 horizontally movable above a substrate W held by a spin chuck 1 (under a blocking plate 10). The gas knife mechanism 70 includes: a gas nozzle 71 having gas dispense ports 71a in a linear slot shape; a nitrogen gas supply tube 72 for supplying, to the gas nozzle 71, nitrogen gas serving as inert gas; a nitrogen gas valve 73 disposed at this nitrogen gas supply tube 72; and a gas nozzle moving mechanism 74 for horizontally moving the gas nozzle 71 above the spin chuck 1. Provision is made such that the opening/closing of the nitrogen gas valve 73 and the operation of the gas nozzle moving mechanism 74 are controlled by the control device 40.

The gas nozzle 71 forms a gas knife 76 by nitrogen gas ejected from the gas dispense ports 71a, and the gas knife 76 forms a linear gas spraying zone 75 on the top of the substrate W. This gas spraying zone 75 covers a region longer than the diameter of the substrate W.

Further, the substrate processing apparatus includes a pair of moving nozzles 77, 78 capable of moving the deionized water supply position on the substrate W while supplying, to the top of the substrate W, deionized water serving as a rinsing liquid. Supplied to these moving nozzles 77, 78 is deionized water from a deionized water supply source through a deionized water valve 79. Opening/closing of the deionized water valve 79 is controlled by the control device 40 above-mentioned. Further disposed is a nozzle moving mechanism 80 for horizontally moving the moving nozzles 77, 78 above the spin chuck 1. Provision is made such that the operation of the nozzle moving mechanism 80 is also controlled by the control device 40.

According to the first embodiment mentioned earlier, the liquid mass of deionized water 45 on the top of the substrate W is removed by inclining the substrate W. According to this second embodiment, however, the liquid mass of deionized water 45 is removed from the top of the substrate W, not by inclining the substrate W, but by the gas knife mechanism 70.

That is, according to the second embodiment, the steps shown in FIG. 4 (a) to (c) are executed in the same manner as in the first embodiment, and the gas nozzle moving mechanism 74 is operated in the state in which there is formed the liquid mass of deionized water 45 covering substantially the whole area of the top of the substrate W in the horizontal posture. More specifically, the control device 40 opens the nitrogen gas valve 73 to supply nitrogen gas to the gas nozzle 71, and operates the gas nozzle moving mechanism 74. Then, the gas spraying zone 75 of the gas nozzle 71 unidirectionally scans the top of the substrate W from one peripheral end to the other peripheral end opposite thereto. Accordingly, the gas knife 76 formed by the nitrogen gas ejected from the gas nozzle 71 sweeps off the liquid mass of deionized water 45, thus causing the same to be removed from the substrate W.

Further, the control device 40 controls the nozzle moving mechanism 80 such that the liquid arriving points of the moving nozzles 77, 78 are moved, at the downstream side of the gas spraying zone 75 in the gas knife 76 moving direction R, in the same direction as the gas knife 76 moving direction R.

Thus, the liquid mass of deionized water 45 is removed from the top of the substrate W by the gas knife 76 while deionized water is supplied to the downstream side in the gas knife 76 moving direction, thus enabling to prevent the liquid mass of deionized water 45 from being fragmented. Therefore, the liquid mass of deionized water 45 is removed from the top of the substrate W while being maintained in the form of a large liquid mass (preferably a single liquid mass). Thus, there is no likelihood that minute droplets remain on the device forming zone on the top of the substrate W.

In this embodiment, one pair of moving nozzles 77, 78 are so disposed as to supply deionized water onto the top of the substrate W from mutually opposite positions on the substrate W top. The moving nozzles 77, 78 may be straight nozzles or shower nozzles for supplying, onto the top of the substrate W, deionized water as dispersed in the form of shower. A pair of moving nozzles are not necessarily required, but provision may be made such that a single moving nozzle resupplies deionized water onto the liquid mass 45 on the top of the substrate W.

The control device 40 closes the deionized water valve 79 when or just before the liquid arrival points of the moving nozzles 77, 78 reach the peripheral end of the substrate W. Upon completion of the scanning of the gas spraying zone 75 of the gas knife 76 on the entire area of the top of the substrate W, the control device 40 controls the gas nozzle moving mechanism 74 to retreat the gas nozzle 71 to the side of the spin chuck 1, and closes the nitrogen gas valve 73.

Thereafter, the drying step shown in FIG. 4 (*e*) is executed likewise in the first embodiment. More specifically, the control device 40 controls the chuck rotational driving mechanism 2 to rotate the spin chuck 1 at a high speed, causing minute droplets remaining at the peripheral end face of the substrate W to be shaken off. Further, the control device 40 controls the blocking plate vertically driving mechanism 21 such that the substrate facing surface 11 of the blocking plate 10 is brought closer to the top of the substrate W, and also controls the blocking plate rotationally driving mechanism 22 to rotate the blocking plate 10.

Thus, according to the second embodiment, too, the liquid mass of deionized water 45 on the top of the substrate W is removed therefrom as maintained in a large mass. This restrains or prevents streaky particles from being formed on the top of the substrate W.

Figure 10:
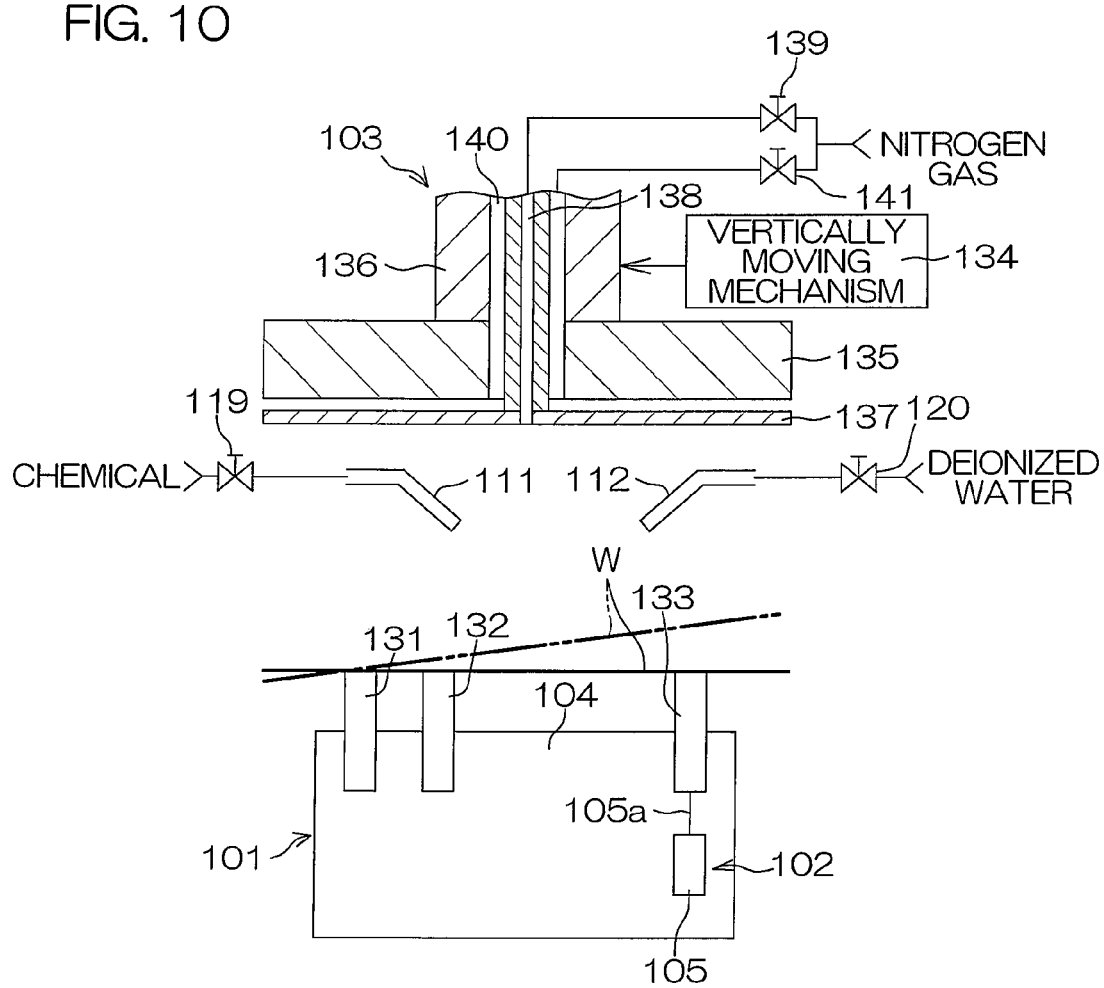
FIG. 10 is a schematic section view illustrating the arrangement of a substrate processing apparatus according to a third embodiment of the present invention.
Figure 11:
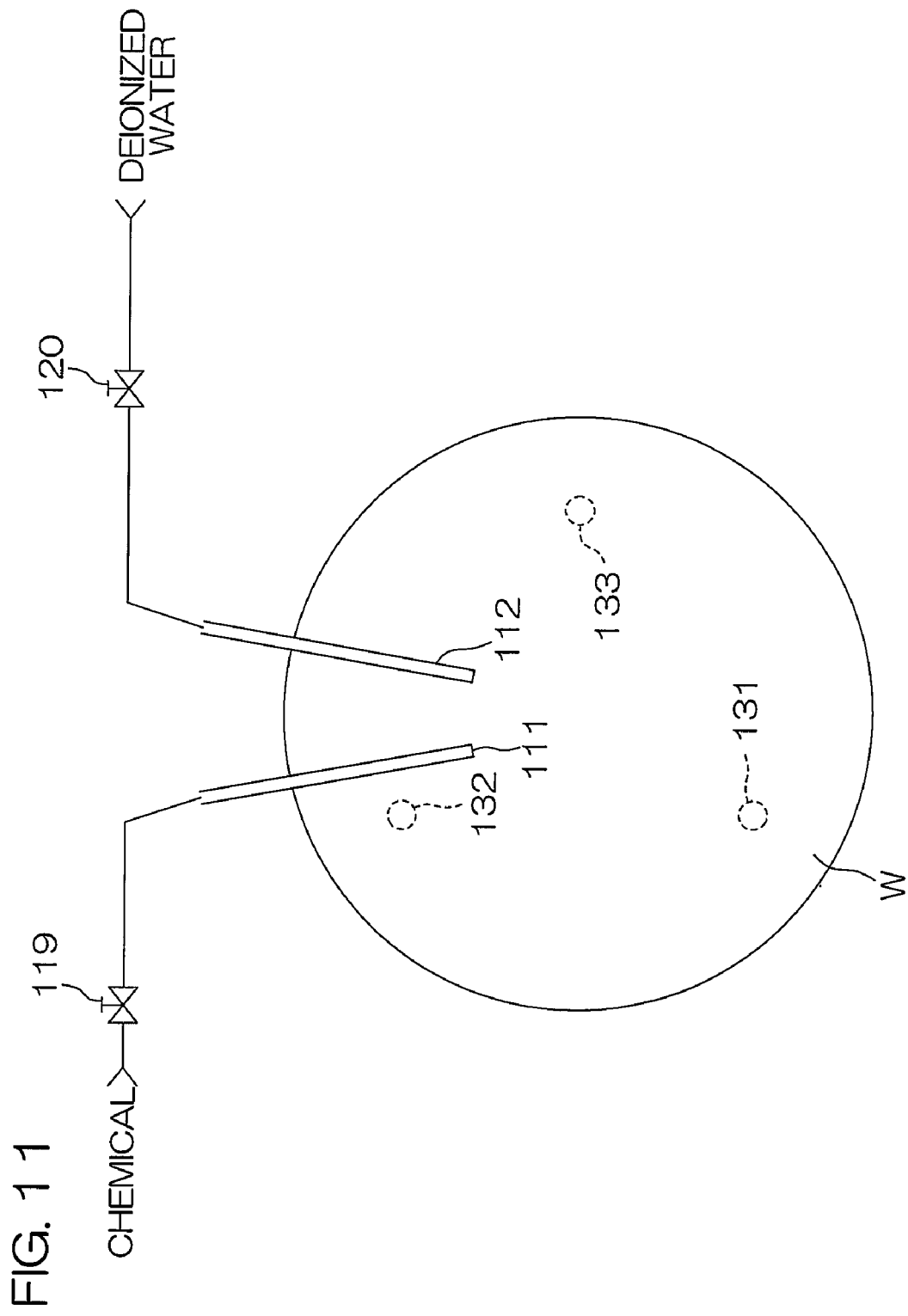
FIG. 11 is a schematic plan view of the substrate processing apparatus according to the third embodiment.

FIG. 10 is a schematic section view illustrating the arrangement of a substrate processing apparatus according to a third embodiment of the present invention. FIG. 11 is a schematic plan view of FIG. 10. The substrate processing apparatus includes: a substrate holding mechanism 101 for holding a single substrate W in a non-rotation state; a substrate posture changing mechanism 102 for changing the posture of the substrate W held by the substrate holding mechanism 101 to a horizontal posture or an inclined posture; a chemical nozzle 111 for supplying a chemical onto the top of the substrate W held by the substrate holding mechanism 101; a deionized water nozzle 112 for supplying deionized water serving as a rinsing liquid onto the top of the substrate W held by the substrate holding mechanism 101; and a substrate drying unit 103 for drying the substrate W on the substrate holding mechanism 101. FIG. 11 shows a plan view of the arrangement with the substrate drying unit 103 removed.

The substrate holding mechanism 101 is arranged to hold a substrate W, in a non-rotation state, with the device forming surface thereof turned up. The substrate holding mechanism 101 has a base 104 and three support pins 131, 132, 133 projecting from the top of the base 104. The support pins 131, 132, 133 are respectively disposed at three positions corresponding to the vertexes of a regular triangle of which gravity center passes through the center of the substrate W (In FIG. 10, however, the support pins 131, 132, 133 are shown, for the sake of convenience, in a manner different from the actual arrangement.). These support pins 131, 132, 133 are vertically disposed and attached to the base 104. Of these, one support pin 133 is vertically movably attached to the base 104, while other two support pins 131, 132 are fixedly attached to the base 104. These support pins 131, 132, 133 are arranged such that their heads come in contact with the underside of the substrate W, thus supporting the same. The substrate posture changing mechanism 102 has a cylinder 105 for vertically moving the support pin 133 out of the support pins 131, 132, 133. A driving shaft 105*a* of the cylinder 105 is coupled to the support pin 133. Accordingly, by driving the cylinder 105, the support pin 133 can be vertically moved such that its substrate supporting height becomes different from the substrate supporting heights of other two support pins 131, 132. As a result, the substrate W can be inclined from a horizontal posture shown by a solid line in FIG. 10 to an inclined posture shown by a two-dot chain line in FIG. 10.

The two support pins 131, 132 which have been discussed as fixedly attached to the base 104, are not necessarily fixed, but may be vertically movably attached to the base 104 as done with the support pin 133. That is, as far as at least one support pin out of the support pins 131, 132, 133 is vertically movably attached to the base 104, the substrate W can be inclined. Further, when at least two support pins are vertically movably attached to the base 104, the substrate W inclination direction can optionally be selected.

In this embodiment, the chemical nozzle 111 is a straight nozzle for ejecting a chemical substantially to the center of the substrate W. Provision is made such that a chemical is supplied to the chemical nozzle 111 through a chemical valve 119.

Provision is also made such that deionized water from a deionized water supply source is supplied to the deionized water nozzle 112 through a deionized water valve 120. In this embodiment, the deionized water nozzle 112 is a straight nozzle for supplying deionized water substantially toward the center of the substrate W.

The substrate drying unit 103 is disposed above the substrate holding mechanism 101. The substrate drying unit 103 has a plate heater (e.g., ceramics heater) 135 in the form of a disk having a diameter substantially identical with that of the substrate W. This plate heater 135 is supported substantially horizontally by a support tube 136 to be vertically moved by a vertically moving mechanism 134. Further disposed under the plate heater 135 is a thin filter plate 137 in the form of a disk having a diameter substantially identical with that of the plate heater 135. The filter plate 137 is substantially horizontal (i.e., substantially in parallel with the plate heater 135). The filter plate 137 is made of a quartz glass, and the disk-like heater 135 is capable of irradiating infrared rays onto the top of the substrate W through the filter plate 137 made of quartz glass.

Formed inside of the support tube 136 is a first nitrogen gas supply path 138 for supplying, onto the center portion of the top of the substrate W, nitrogen gas serving as cooling gas of which temperature is being adjusted substantially to the room temperature (about 21° C.~about 23° C.). The nitrogen gas supplied from the first nitrogen gas supply path 138 is supplied into the space between the top of the substrate W and the underside (substrate facing surface) of the filter plate 137. Provision is made such that nitrogen gas is supplied to the first nitrogen gas supply path 138 through a nitrogen gas valve 139.

Further formed around the first nitrogen gas supply path 138 is a second nitrogen gas supply path 140 for supplying, into the space between the top of the filter plate 137 and the underside of the plate heater 135, nitrogen gas serving as cooling gas of which temperature is being adjusted substantially to the room temperature (about 21° C.-about 23° C.). The nitrogen gas supplied from the second nitrogen gas supply path 140 is supplied into the space between the top of the filter plate 137 and the underside of the plate heater 135. Provision is made such that nitrogen gas is supplied to the second nitrogen gas supply path 140 through a nitrogen gas valve 141.

For drying a substrate W on the substrate holding mechanism 101, the plate heater 135 is conducted, the nitrogen gas valves 139, 141 are opened, and the substrate facing surface (underside) of the filter plate 137 is brought closer to the top of the substrate W (e.g., by a distance of about 1 mm). This causes the moisture on the substrate W surface to be evaporated by infrared rays which have passed through the filter plate 137.

The filter plate 137 made of quartz glass absorbs, out of the infrared rays, infrared rays in a specific wavelength range. More specifically, out of the infrared rays irradiated by the plate heater 135, the infrared rays having a wavelength to be absorbed by the quartz glass, are intercepted by the filter plate 137 and are therefore hardly irradiated onto the substrate W. Then, the infrared rays in the wavelength range which transmits the filter plate 137 or quartz glass, are selectively irradiated onto the substrate W. More specifically, the plate heater 135 comprising a ceramic infrared heater irradiates infrared rays in the wavelength range of about 3 μm-about 20 μm. For example, quartz glass having a thickness of 5 mm absorbs infrared rays in a wavelength of 4 μm or more. Accordingly, when such a ceramic infrared heater and quartz glass are used, infrared rays of which wavelength is in the range from about 3 μm to 4 μm, are selectively irradiated to the substrate W.

On the other hand, water has the nature of particularly absorbing the infrared rays of which wavelength is 3 μm, and the infrared rays of which wavelength is 6 μm. The energy of the infrared rays absorbed by water, vibrates water molecules and friction heat is generated among the water molecules thus vibrated. That is, water can efficiently be heated and dried by irradiating, to the water, infrared rays having the wavelength which the water particularly absorbs. Accordingly, when infrared rays having the wavelength of about 3 μm are irradiated onto the substrate W, the minute droplets of deionized water attached onto the substrate W, absorb the infrared rays, and are therefore heated and dried.

On the other hand, the substrate W itself, when made of silicon, has the nature of absorbing the infrared rays having a wavelength longer than 7 μm, and of transmitting the infrared rays having a wavelength shorter than 7 μm. Accordingly, even though the infrared rays having a wavelength of 3 μm are irradiated onto the substrate W, the substrate W is hardly heated. That is, out of the infrared rays irradiated by the ceramic infrared heater, infrared rays in a wavelength range which are efficiently absorbed by water and which the substrate W itself transmits, are selectively irradiated onto the substrate W. Thus, minute droplets attached to the substrate W can efficiently be heated and dried with the substrate W hardly heated. For the filter plate 137, there may be used a material having the nature of transmitting infrared rays in a wavelength efficiently absorbed by water, and of absorbing infrared rays in a wavelength which the substrate W itself absorbs.

When the plate heater (ceramic heater) 135 is conducted, there is considered the transmission of convection heat from the plate heater 135 to the substrate W. However, this heat transmission is intercepted by the filter plate 137. However, the space between the underside of the plate heater 135 and the top of the filter plate 137 is raised in temperature by the convection heat. Accordingly, there is a likelihood that the filter plate 137 is gradually heated, that the convection heat from the filter plate 137 is transmitted to the substrate W, causing the same to be heated. In this connection, nitrogen gas is supplied, as cooling gas, into the space between the underside of the plate heater 135 and the top of the filter plate 137, thereby to restrain this space from being raised in temperature. Further, the filter plate 137 absorbs infrared rays from the plate heater 135, but the supply of nitrogen gas between the plate heater 135 and the filter plate 137, restrains the filter plate 137 from being raised in temperature, thus preventing the substrate W from being heated due to the convection heat from the filter plate 137.

Figure 12:
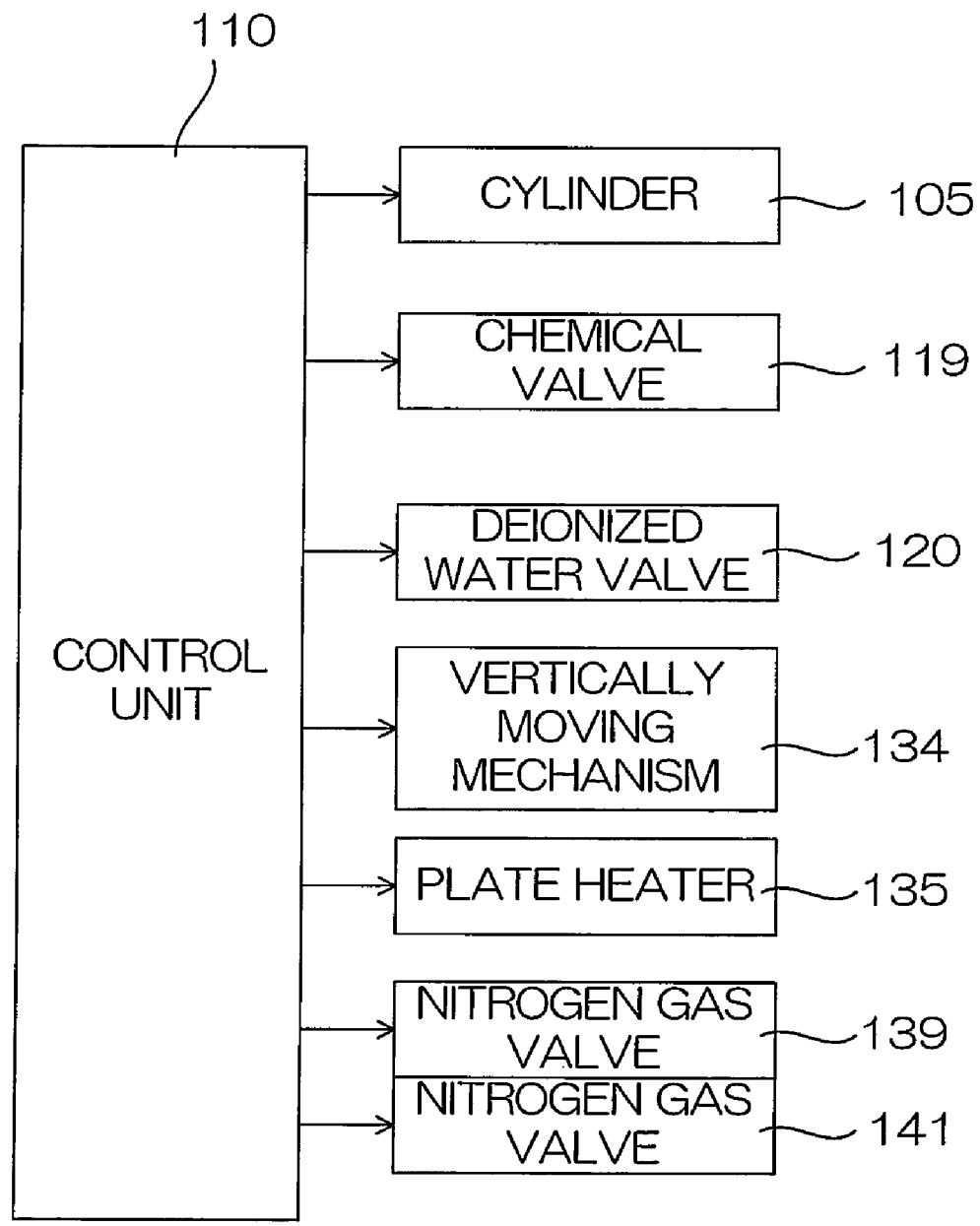
FIG. 12 is a block diagram illustrating the arrangement for controlling the substrate processing apparatus according to the third embodiment.

FIG. 12 is a block diagram illustrating the arrangement for controlling the above-mentioned substrate processing apparatus. This substrate processing apparatus has a control unit 110 including a computer and the like. This control unit 110 is arranged to control the operation of the cylinder 105, the opening/closing of the chemical valve 119 and the deionized water valve 120, the operation of the vertically moving mechanism 134, the conduction of the plate heater 135 and the opening/closing of the nitrogen gas valves 139, 140.

Figure 13:
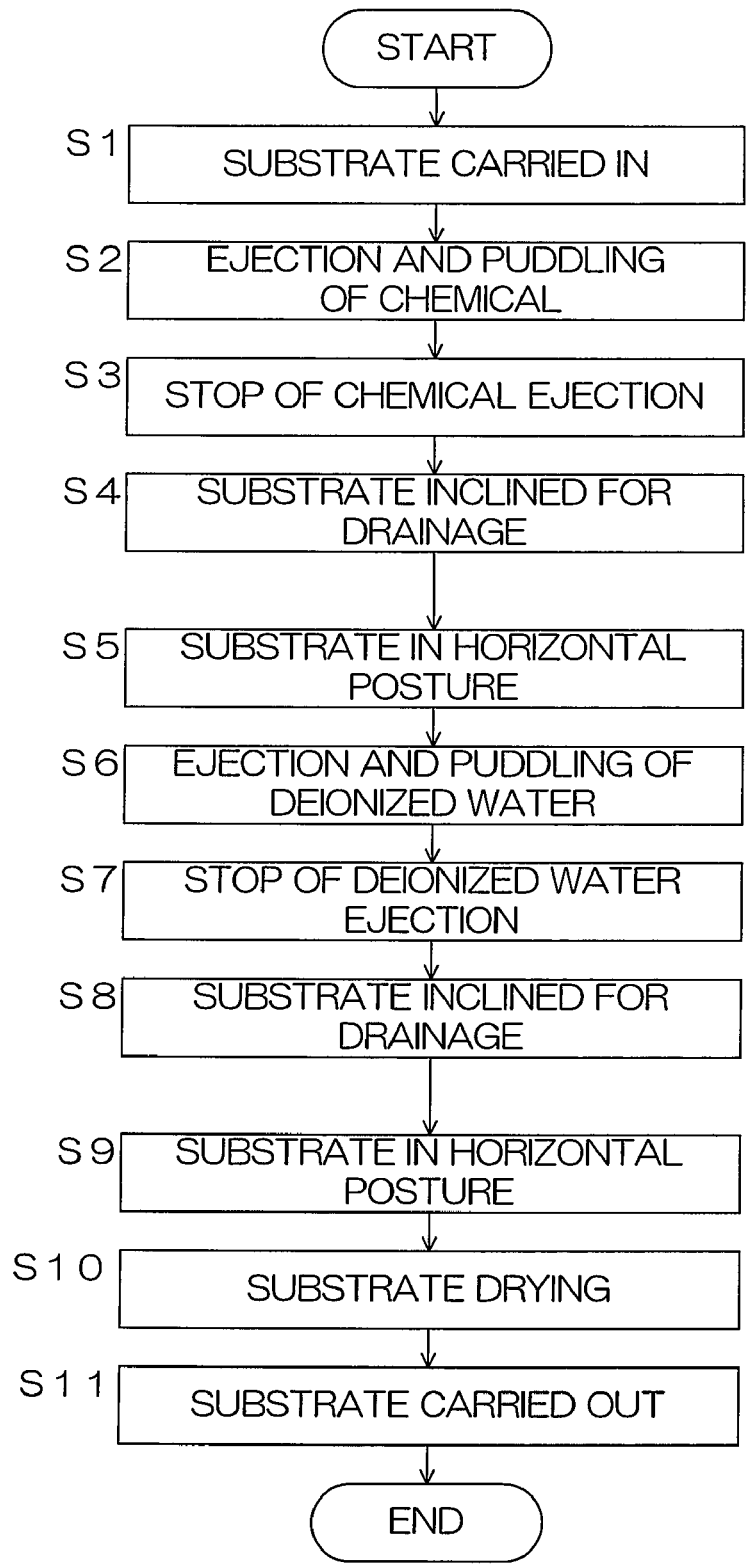
FIG. 13 is a flowchart illustrating an example of the operation of the substrate processing apparatus according to the third embodiment.

FIG. 13 is a flowchart illustrating an example of the operation of this substrate processing apparatus. An untreated substrate W is carried in the substrate processing apparatus by a substrate transfer robot (not shown) and delivered to the support pins 131, 132, 133 of the substrate holding mechanism 101 (Step S1). At this time, the support pins 131, 132, 133 are equal to one another in substrate supporting height, causing the substrate W to be supported in a horizontal posture. In this state, the control unit 110 opens the chemical valve 119 to eject a chemical toward the center of the substrate W from the chemical nozzle 111 (Step S2). At this time, the chemical flow rate is set such that the chemical supplied onto the top of the substrate W is held as puddled. Thus, the chemical can be puddled on the top of the substrate W. A chemical relatively low in viscosity (e.g., a mixed liquid of ammonia and a hydrogen peroxide solution) is readily spread on the surface of the substrate W in its entire area when supplied by the chemical nozzle 111 of the straight nozzle type. When the chemical is distributed on the entire area of the substrate W surface, the control unit 110 closes the chemical valve 119 to stop the supply of the chemical (Step S3). The state in which the chemical is being puddled on the top of the substrate W in a horizontal posture, is held for a predetermined period of time. As far as the substrate W is maintained in the horizontal posture, the puddled chemical is maintained on the top of the substrate W due to its surface tension.

Thereafter, the control unit 110 drives the cylinder 105 to raise the substrate supporting height of the support pin 133. This brings the substrate W into an inclined posture in which the substrate W is downwardly inclined in the direction from the support pin 133 to the center of the substrate W. This causes the chemical puddled on the top of the substrate W to flow down from the substrate W (Step S4).

After the substrate inclined posture has been maintained for a predetermined period of time, the control unit 110 drives the cylinder 105 to return the substrate supporting height of the support pin 133 to the original height. This causes the substrate W to be in the horizontal posture (Step S5). In this state, the control unit 110 opens the deionized water valve 120 to eject deionized water toward the center of the substrate W from the deionized water nozzle 112 (Step S6). The flow rate of the deionized water supplied at this time is set such that the deionized water is puddled on the surface of the substrate W in the horizontal posture. Thus, when the deionized water is puddled on the top of the substrate W and the deionized water is distributed in the whole area thereof, the control unit 110 closes the deionized water valve 120 (Step S7). The deionized water on the substrate W is held as puddled on the substrate W due to its surface tension as far as the substrate W is held in the horizontal posture.

After the state in which the deionized water is puddled on the top of the substrate W has been held for a predetermined period of time, the control unit 110 drives the cylinder 105 to raise the substrate supporting height of the support pin 133, thus bringing the substrate W in an inclined posture. Thus, the deionized water puddled on the top of the substrate W flows down from the substrate W, and is removed therefrom (Step S8).

After the substrate W has been maintained in the inclined posture for a predetermined period of time, the control unit 110 drives the cylinder 105 to return the substrate supporting height of the support pin 133 to the original height. This returns the substrate W to the horizontal posture (Step S9).

Then, the control unit 110 drives the vertically moving mechanism 134 to lower the plate heater 135 up to a predetermined processing position in which the substrate facing surface (underside) of the filter plate 137 is brought closer to the top of the substrate W by a predetermined distance (e.g., 1 mm). It is a matter of course that prior to this lowering operation of the plate heater 135, the chemical nozzle 111 and the deionized water nozzle 112 are retreated outside of the substrate W. In this state, the control unit 110 controls to conduct the plate heater 135. Thus, the infrared rays reaching the substrate W surface after having passed through the filter plate 137, evaporate droplets remaining on the substrate W after substrate inclination and liquid removal. Further, the control unit 110 opens the nitrogen gas valves 139, 141 to supply nitrogen gas to the first and second nitrogen gas supply paths 138, 140. Accordingly, nitrogen gas (cooling gas) adjusted to the room temperature is supplied to both the space between the substrate W and the filter plate 137 and the space between the filter plate 137 and the plate heater 135. Thus, while the heat transmission from the plate heater 135 and the filter plate 137 to the substrate W is restrained, the nitrogen gas atmosphere is maintained on the substrate W top, the infrared rays are absorbed by droplets remaining on the substrate W top and nitrogen gas is supplied from the first nitrogen gas supply path 138, thus executing the substrate drying processing (Step S10).

After this drying processing, the treated substrate W is carried outside of the substrate processing apparatus by a substrate transfer robot (Step S11).

In the manner above-mentioned, the processings of one substrate W are completed. When there is still an untreated substrate, similar processings are repeated.

As thus discussed in the foregoing, according to this embodiment, by the arrangement in which at least one of three support pins 131, 132, 133 disposed in the substrate holding mechanism 101, is vertically moved by the cylinder 105, the substrate W supported by the support pins 131, 132, 133 can be inclined and a chemical or deionized water on the substrate W can be removed Further, according to the embodiment above-mentioned, a treating liquid is supplied to the substrate W held either in horizontal posture or inclined posture, and not to the substrate W rotated by the substrate holding mechanism 101. That is, with the substrate W held in a non-rotation state, the top of the substrate W is covered with a treating liquid film and the surface treatment of the substrate W is conducted with this treating liquid. Accordingly, there is not a likelihood that a treating liquid swiftly springs outside of the substrate W. This eliminates the provision of a guard or the like for receiving a scattering treating liquid. This simplifies the entire arrangement, thus contributing to a reduction in cost of the substrate processing apparatus. Further, the diffusion of treating liquid splashes into the apparatus can remarkably be restrained as compared with a conventional apparatus. Therefore, the atmosphere diffusion from the substances to which the chemical has been attached, can also be restrained or prevented. Further, there is no likelihood that droplets sprung out from the substrate W at a high speed, rebound from a guard and reattach to the substrate W. This improves the substrate processing in quality.

Further, it is not required to rotate the substrate W at a high speed, thus eliminating the need of a motor for substrate rotation. Accordingly, dust preventive measures around a motor are neither required. This results in further reduction in production cost of the substrate processing apparatus.

Further, since neither guard nor motor is required, no large space is required around the substrate holding mechanism 101. Accordingly, since the substrate W can be processed with a liquid in a small space, the substrate processing apparatus can remarkably be miniaturized. In other words, when the substrate processing apparatus is identical in size with a conventional apparatus, a great number of substrate processing units can be disposed in the substrate processing apparatus. More specifically, a great number of substrate processing units of the same type or different types can be disposed as vertically laminated.

Further, since provision is made such that a chemical processing is executed with a chemical puddled on the substrate W, the amount of use of a chemical can remarkably be reduced. This reduces the running cost. Further, since the rinsing processing subsequent to the chemical processing is executed with deionized water being puddled, the amount of use of the deionized water can also be reduced. This accordingly reduces the running cost of the apparatus.

Further, in the arrangement in which substrate drying is conducted by rotating the substrate W at a high speed, watermarks may possibly be produced due to minute droplets which radially disperse with high-speed rotation. According to the third embodiment, however, drying with the use of infrared rays is conducted on the substrate W held in a non-rotation state. This restrains or prevents the generation of watermarks.

Further, since the substrate W is not required to be rotated at a high speed, this eliminates the provision of a support member which rigidly supports the substrate W. This also eliminates the problem of applying a large load to the substrate W due to such a support member, thus restraining or preventing the production of a defective substrate W having breakage or the like.

Further, in the arrangement of rotating the substrate W at a high speed, the friction between a chemical or air and the substrate surface inevitably causes a trouble of static electricity. However, since the third embodiment is arranged to treat the substrate W basically in a non-rotation state, the problem of frictional electrification can be restrained or prevented.

In order to drain a chemical and deionized water as separated from each other, there may be added, for example, a cylinder for vertically moving both or one of the support pins 131, 132. By this arrangement, the substrate W inclination direction can be switched in two or three directions. It is therefore possible to change the treating liquid drain direction dependent on the type of the treating liquid. In the embodiment above-mentioned, the chemical drainage direction can be different from the deionized water drainage direction. This enables the chemical to be collected for re-use and the deionized water to be guided to the factory waste facilities.

It has been discussed that according to the third embodiment, the top of the substrate W held in a non-rotation state is covered with a film of a treating liquid and the substrate W surface treatment is conducted with this treating liquid. However, the substrate W surface treatment may be conducted with a treating liquid supplied onto the top of the substrate W which is held in a low-speed rotation state (e.g., in the range of about 10 to about 200 rpm). Alternatively, the substrate W may be rotated at a low rotational speed only during the time the substrate W is dried by the substrate drying unit 103. Such low-speed rotation of the substrate W can be achieved, for example, by rotating a plurality of rollers of which rotating shafts are substantially at right angles to the substrate W surface and which come in contact with the end face of the substrate W. In such a case, since the substrate W is not rotated at a high speed, there may be used an economical and small rotation drive source such as a motor, a cylinder and the like. This is advantageous in view of cost and space. Further, at the time of supplying a treating liquid, scattering of a treating liquid can be minimized. Further, the low-speed rotation of the substrate W may be continuous or intermittent.

In the foregoing, the present invention has been discussed as to three embodiments, but the present invention may also be embodied in other forms. For example, each of the first and second embodiments adopts the spin chuck 1 comprising a so-called mechanical chuck for holding the peripheral end face of a substrate W, but there may be used a spin chuck of a vacuum chuck type for holding a substrate W with the underside thereof adsorbed. Further, the substrate drying unit 103 discussed in connection with the third embodiment may be used in each of the first and second embodiments. In such a case, since it is not required to rotate a substrate W at a high speed at the drying step, there may be used a substrate holding mechanism for holding a substrate W in a non-rotation state or a low-speed rotation state.

In the embodiments above-mentioned, nitrogen gas is used as the inert gas, but argon gas may also be used as the inert gas. Instead of the inert gas, there may be used air (clean air) purified by a filter or the like. There may also be conducted the gas drying step with the use of such inert gas or purified air. More specifically, instead of the use of the substrate drying unit 103 above-mentioned, the substrate W surface may be dried by supplying, to the substrate W surface, clean air or inert gas set to a room temperature (e.g., 23° C.) or heated to 40° C. to 150° C. In such a case, too, it is not necessarily required to rotate the substrate W at a high speed at the gas drying step, and there may be used a substrate holding mechanism for holding a substrate W in a non-rotation state or in a low-speed rotation state. At the time of drying with the use of gas such as inert gas, clean air or the like, vapor of an organic solvent such as IPA (isopropyl alcohol) vapor, HFE (hydrofluoroether) vapor may jointly be supplied.

At the drying step, there may be applied a low-pressure drying step of decompressing the space around the substrate W, e.g., the processing chamber which houses at least the substrate holding mechanism (1,101) in each of the first to third embodiments.

Further, in the embodiments above-mentioned, deionized water is used as the rinsing liquid, but there may also be used, as the rinsing liquid: a functional fluid such as carbonated water, electrolytic ionized water, hydrogen water, magnetic water or the like; or ammonia water of small concentration (e.g., about 1 ppm).

Further, in the first embodiment, there have been shown, as examples of the substrate W inclining mechanism, a mechanism of inclining only a substrate W (FIG. 1) and a mechanism of inclining the spin chuck 1 (FIG. 7). However, the substrate inclining mechanism may be arranged to incline the whole processing chamber which houses the spin chuck 1 and the like, or to incline the substrate processing apparatus in its entirety to incline the substrate W with respect to the horizontal plane.

Figure 14:
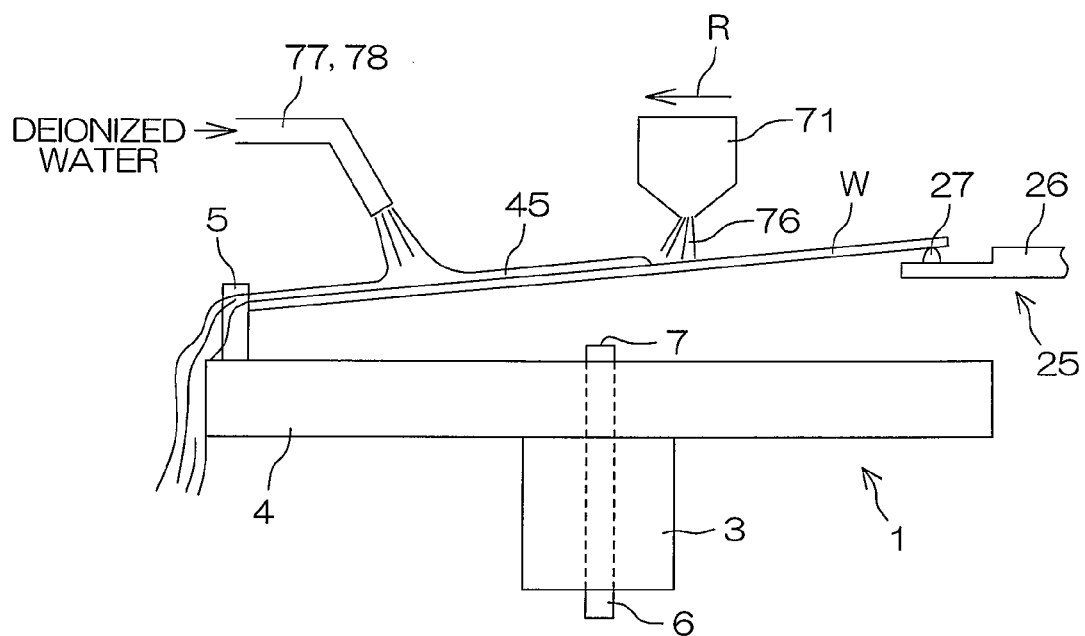
FIG. 14 is a schematic view of an embodiment in which a liquid mass of deionized water on the substrate is removed with the combination use of the inclination of a substrate and a gas knife.
Figure 15A:
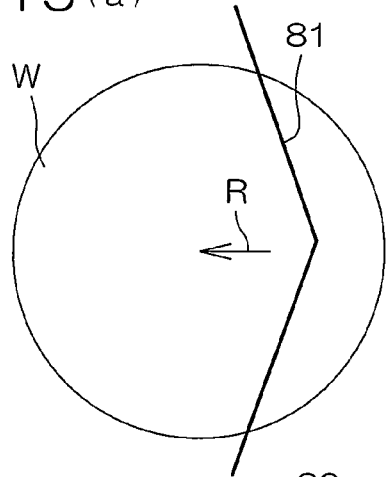
FIG. 15 (*a*) to FIG. 15 (*e*) are schematic views of modifications of a gas spraying zone shape.
Figure 15B:
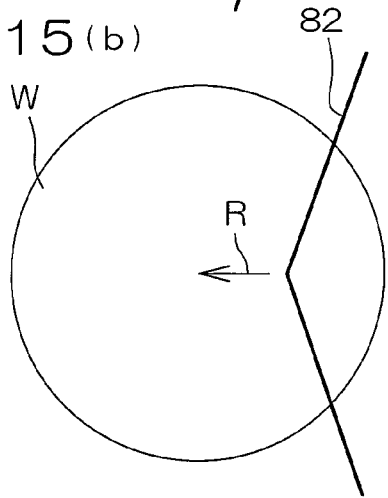
Figure 15C:
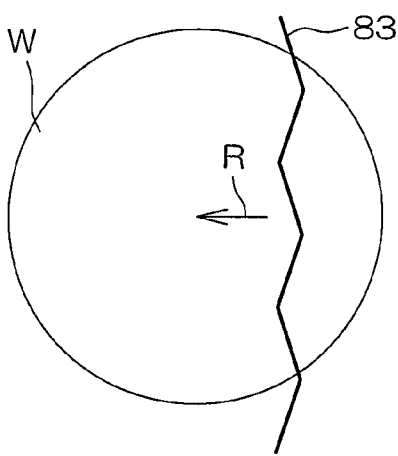
Figure 15D:
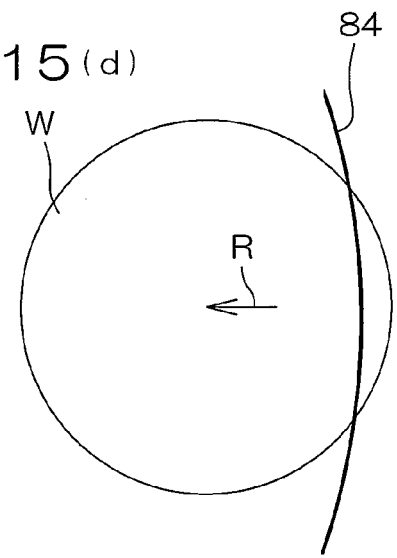
Figure 15E:
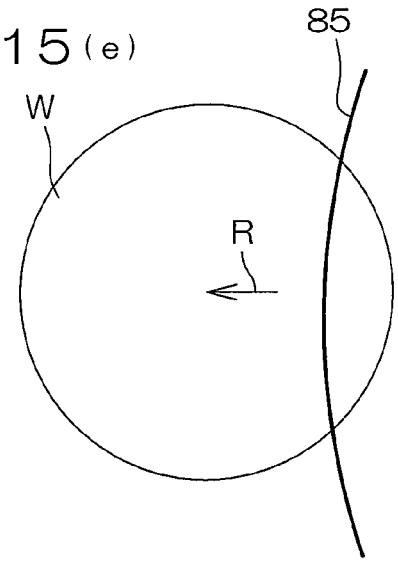

As schematically shown in FIG. 14, the first and second embodiments may be combined with each other such that a substrate W is inclined and at the same time, the liquid mass of deionized water 45 is swept out toward the lower side of the inclined substrate W by the gas knife 76 formed at the gas nozzle 71. In such a case, too, deionized water is preferably resupplied, at the downstream side in the gas knife 76 moving direction, to the liquid mass of deionized water 45 from the moving nozzles 77, 78, thus preventing the liquid mass of deionized water 45 from being fragmented.

The second embodiment uses the gas nozzle 71 which forms the linear gas spraying zone 75 on the substrate W surface. However, there may be used any of gas nozzles which form gas spray zones of the bent-line type 81, 82, 83 as shown in FIG. 15(*a*), 15(*b*), 15(*c*), and there may also be used any of gas nozzles which form arcuate gas spray zones 84, 85 as shown in FIG. 15(*d*), (e).

For example, each of the gas spray zones 81, 84 in FIG. 15(*a*), 15(*d*) has a shape of which center portion is concaved toward the upstream side in the gas knife moving direction R. In this case, the liquid mass of deionized water is pushed in the moving direction R while inwardly gathering the deionized water on the substrate W top, thus making it difficult to fragment the liquid mass of deionized water.

As the gas nozzle, there may be applied, instead of a gas nozzle for forming a linear gas spraying zone on the substrate W, a gas nozzle for forming an elliptical gas spraying zone thereon.

Further, each of the embodiments above-mentioned is arranged to remove, from the substrate surface, the rinsing liquid (deionized water) in the form of a single liquid mass. However, in the rinsing liquid drain processing, the rinsing liquid mass may be fragmented into a plurality of masses as far as no minute droplets remain on the substrate surface. For example, in each of the embodiments in FIG. 15(*b*), 15(*c*), 15(*e*), the liquid mass is fragmented into two or three pieces at the terminal stage of the rinsing liquid drain processing.

Each of the embodiments above-mentioned is arranged such that at the liquid film covering step, the substrate W top is covered substantially in its entirety with a liquid film (liquid mass of deionized water), but only a portion of the substrate W top may be covered with a liquid film.

Each of the first and third embodiments may include a liquid absorbing member for absorbing the droplets remaining at the substrate end face after the substrate W has been inclined to remove the rinsing liquid on the substrate W surface. Such a liquid absorbing member may be formed of a porous material such as a PVA sponge or a reduced-pressure nozzle connected to a reduced-pressure mechanism such as Convum or the like. It is preferable to attach such a liquid absorbing member to a movable arm capable of moving toward or away from the substrate W. According to such an arrangement, after the rinsing liquid has been removed from the substrate W surface, the liquid absorbing member attached to the movable arm moves toward the substrate W and comes close to or in contact with the substrate W end face portion located in the lowest position when the substrate W is inclined, and then absorbs the droplets on the substrate W end face. Thus, at the subsequent substrate W drying step, the substrate W can more securely be dried.

In the embodiments above-mentioned, the description has been made of a substrate W of which device forming face (top) is hydrophobic, but the present invention may also be applied to a hydrophilic substrate. Further, in the embodiments above-mentioned, the description has been made of a circular substrate W to be treated, but the present invention may also be applied to apparatus arranged to treat a rectangular substrate such as a liquid-crystal-display-device glass substrate or a plasma-display glass substrate.

It should be understood that a variety of other modifications and changes in designing may be applied within the scope of the present invention described in the appended claims.

What we claimed is:

1. A substrate processing apparatus comprising:
   a substrate holding and rotating mechanism having a spin base and arranged to rotate a substrate while holding the substrate, above the spin base, with one surface thereof directed upward;
   a rinsing liquid supply mechanism for supplying a rinsing liquid onto the one surface of the substrate held in non-rotation state by the substrate holding and rotating mechanism; and
   a substrate inclining mechanism for inclining the substrate held on the substrate holding and rotating mechanism from a horizontal posture in which the one surface extends along a horizontal plane, to an inclined posture in which the one surface is inclined at a predetermined angle with respect to the horizontal plane, the substrate inclining mechanism including an arm extending horizontally, an up-and-down moving member disposed at a tip of the arm, and an arm driving mechanism for moving the arm, wherein the arm driving mechanism moves the arm such that the up-and-down moving member enters into a space between the spin base and the substrate held by the substrate holding and rotating mechanism, and is brought into contact with only a peripheral portion of another surface of the substrate opposite to said one surface, to raise up the peripheral portion to incline the substrate.

2. A substrate processing apparatus according to claim 1, wherein the substrate inclining mechanism is arranged to incline the substrate such that a rinsing liquid on the one surface is downwardly moved and then removed while it is maintained in a form of a liquid mass on the one surface.

3. A substrate processing apparatus according to claim 2, wherein the substrate inclining mechanism is arranged to incline the substrate such that a rear edge of the liquid mass is moved on the one surface of the substrate at a speed in the range of 3 mm to 20 mm per second.

4. A substrate processing apparatus according to claim 1, further comprising a contact member arranged to come in contact with a lower-side end face of the substrate in the inclined posture when the substrate is inclined by the substrate inclining mechanism, whereby the rinsing liquid dropping off from the substrate falls down along the contact member.

5. A substrate processing apparatus according to claim 1, further comprising control means for controlling the rinsing liquid supply mechanism and the substrate inclining mechanism such that a part or an entire area of the one surface of the substrate horizontally held by the substrate holding mechanism, is covered with a film of a rinsing liquid supplied by the rinsing liquid supply mechanism and that the substrate is then inclined by the substrate inclining mechanism.

6. A substrate processing apparatus according to claim 5, further comprising an inert gas supply mechanism for supplying inert gas onto the one surface of the substrate held by the substrate holding and rotating mechanism,
   wherein the control means further controls the inert gas supply mechanism such that when inclining the substrate to remove the rinsing liquid from the one surface thereof, inert gas from the inert gas supply mechanism is supplied onto the one surface of the substrate at at least its zone from which the rinsing liquid has been removed.

7. A substrate processing apparatus according to claim 6, further comprising:
   a blocking member having a substrate facing surface movable toward the one surface of a substrate held by the substrate holding and rotating mechanism; and
   a blocking member moving mechanism for moving the blocking member toward or away from the one surface of the substrate held by the substrate holding and rotating mechanism,
   wherein the control means further controls the blocking member moving mechanism such that when inert gas from the inert gas supply mechanism is supplied onto the one surface of the substrate, the substrate facing surface of the blocking member is located in a predetermined position in close proximity to the one surface of the substrate.

8. A substrate processing apparatus according to claim 1, further comprising control means for controlling the substrate inclining mechanism and the substrate holding and rotating mechanism such that after the substrate has been inclined by the substrate inclining mechanism to remove the rinsing liquid from the one surface of the substrate held by the substrate holding and rotating mechanism, a liquid component present on the substrate is dried by rotating the substrate by means of the substrate holding and rotating mechanism.

9. A substrate processing apparatus according to claim 8, wherein
   the control means is arranged such that when drying the substrate, the substrate is rotated by the substrate holding and rotating mechanism to shake off droplets remaining on an end face of the substrate.

10. A substrate processing apparatus according to claim 9, wherein the control means is arranged such that after the substrate has been inclined by the substrate inclining mechanism to remove the rinsing liquid from the one surface of the substrate, the substrate is returned to the horizontal posture from the inclined posture by the substrate inclining mechanism and that the substrate is then rotated by the substrate holding and rotating mechanism to shake off droplets remaining on the end face of the substrate.

11. A substrate processing apparatus according to claim 1, further comprising substrate drying means including infrared ray generating means for irradiating infrared rays to the substrate held by the substrate holding mechanism.

12. A substrate processing apparatus according to claim 1, further comprising a rinsing liquid replenishing mechanism for newly supplying a rinsing liquid onto the rinsing liquid present on the one surface of the substrate brought into the inclined posture by the substrate inclining mechanism.

13. A substrate processing apparatus comprising:
- a substrate holding mechanism capable of holding a substrate with one surface thereof directed upward;
- a rinsing liquid supply mechanism for supplying a rinsing liquid onto the one surface of the substrate held in non-rotation state by the substrate holding mechanism;
- a substrate inclining mechanism for inclining the substrate held by the substrate holding mechanism from a horizontal posture in which the one surface extends along a horizontal plane, to an inclined posture in which the one surface is inclined at a predetermined angle with respect to the horizontal plane;
- substrate drying means for drying the surface of the substrate held by the substrate holding mechanism;
- an inert gas supply mechanism for supplying inert gas onto the one surface of the substrate held by the substrate holding mechanism;
- a blocking member having a substrate facing surface movable toward the one surface of a substrate held by the substrate holding mechanism;
- a blocking member moving mechanism for moving the blocking member toward or away from the one surface of the substrate held by the substrate holding mechanism;
- a blocking member inclining mechanism for inclining the blocking member such that when the substrate is inclined by the substrate inclining mechanism, the substrate facing surface is inclined according to an inclination of the substrate; and
- control means for controlling the rinsing liquid supply mechanism and the substrate inclining mechanism such that a part or an entire area of the one surface of the substrate horizontally held by the substrate holding mechanism, is covered with a film of a rinsing liquid supplied by the rinsing liquid supply mechanism and that the substrate is then inclined by the substrate including mechanism,
- wherein the control means further controls the inert gas supply mechanism such that when inclining the substrate to remove the rinsing liquid from the one surface thereof, inert gas from the inert gas supply mechanism is supplied onto the one surface of the substrate at at least its zone from which the rinsing liquid has been removed;
- wherein the control means further controls the blocking member moving mechanism such that when inert gas from the inert gas supply mechanism is supplied onto the one surface of the substrate, the substrate facing surface of the blocking member is located in a predetermined position in close proximity to the one surface of the substrate.

14. A substrate processing method comprising:
- a substrate holding step of holding a substrate, with one surface thereof exposed to ambient air and directed upward, by a substrate holding mechanism having a spin base;
- a rinsing liquid supply step of supplying a rinsing liquid to drop onto the exposed one surface of the substrate held by the substrate holding mechanism at the substrate holding step so as to form a liquid mass of the rinsing liquid on the one surface of the substrate;
- a substrate inclining step of inclining, after the rinsing liquid supply step, the substrate held in non-rotation state by the substrate holding mechanism from a horizontal posture in which the one surface extends along a horizontal plane, to an inclined posture in which the one surface is inclined at a predetermined angle with respect to the horizontal plane, thereby to downwardly move the rinsing liquid while it is maintained in a form of the liquid mass on the one surface, thus causing the rinsing liquid to be removed therefrom, the substrate inclining step including a step of moving a horizontally extending arm having a tip carrying an up-and-down moving member such that the up-and-down moving member enters into a space between the spin base and the substrate held by the substrate holding mechanism above the spin base, and is brought into contact with only a peripheral portion of another surface of the substrate opposite to said one surface, to raise up the peripheral portion to incline the substrate;
- a returning step of returning the substrate from the inclined posture to the horizontal posture; and
- a drying step of drying the substrate top after the substrate returning step, the drying step including a step of rotating the substrate held by the substrate holding mechanism to shake off droplets remaining at the end face of the substrate.

15. A substrate processing method according to claim 14, wherein the substrate inclining step is arranged to incline the substrate such that a rear edge of the liquid mass is moved on the one surface of the substrate at a speed in the range of 3 mm to 20 mm per second.

16. A substrate processing method according to claim 14, wherein the drying step includes a step of irradiating infrared rays from infrared ray generating means to the substrate held by the substrate holding mechanism.

17. A substrate processing method according to claim 14, wherein the rinsing liquid supply step includes a liquid film covering step of covering, with a rinsing liquid film, a whole area of the one surface of the substrate horizontally held by the substrate holding mechanism at the substrate holding step.

* * * * *